(12) United States Patent
Reiter et al.

(10) Patent No.: US 11,863,186 B2
(45) Date of Patent: Jan. 2, 2024

(54) PULSE COUNTING REGISTERS FOR MONITORING CONTROL SIGNALS OF POWER SWITCHES

(71) Applicant: Infineon Technologies AG, Neubiberg (DE)

(72) Inventors: Tomas Manuel Reiter, Munich (DE); Michael Krug, Munich (DE); Marco Bachhuber, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/656,311

(22) Filed: Mar. 24, 2022

(65) Prior Publication Data

US 2023/0308083 A1    Sep. 28, 2023

(51) Int. Cl.
*H03K 3/017* (2006.01)
*H03K 17/51* (2006.01)

(52) U.S. Cl.
CPC ............ *H03K 3/017* (2013.01); *H03K 17/51* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | | |
|---|---|---|---|---|
| 7,622,887 | B2 * | 11/2009 | Yoshimura | H02M 1/08 318/815 |
| 8,782,503 | B2 * | 7/2014 | Kaeriyama | H01L 25/16 714/48 |
| 9,673,809 | B1 * | 6/2017 | Kandah | H02P 27/08 |
| 9,839,103 | B2 * | 12/2017 | Avrahamy | H05B 39/086 |
| 9,966,779 | B2 * | 5/2018 | Ziv | H05B 39/041 |
| 10,756,644 | B1 * | 8/2020 | Shah | H02M 3/07 |
| 10,862,399 | B1 * | 12/2020 | Rai | H02M 3/33515 |
| 10,917,012 | B1 * | 2/2021 | Heiling | H02M 3/156 |
| 10,944,330 | B1 * | 3/2021 | Lee | H02M 3/33576 |
| 2020/0355745 | A1 * | 11/2020 | Bogus | H02H 7/0833 |

* cited by examiner

*Primary Examiner* — Thomas J. Hiltunen
*Assistant Examiner* — Khareem E Almo
(74) *Attorney, Agent, or Firm* — Shumaker & Sieffert, P.A.

(57) ABSTRACT

This disclosure describes circuits and techniques for identifying potential problems with control signals for power switches. More specifically, this disclosure describes the use of registers, e.g., volatile or non-volatile storage elements, configured to count the rising and/or falling edges of pulse modulation (PM) signals within driver circuits or other control circuits. By counting the edges of PM signals within driver circuits, signaling problems can be identified based on mismatch between different counters. The techniques may be used by a driver circuit to detect circuit problems, or readout of the registers can be done after device failure, in order to help identify whether signaling problems may have caused the device failure.

19 Claims, 15 Drawing Sheets

PULSE COUNTING REGISTERS FOR MONITORING CONTROL SIGNALS OF POWER SWITCHES

TECHNICAL FIELD

This disclosure relates to power switches, and more specifically, techniques and circuits for identifying potential problems with control signals for power switches.

BACKGROUND

Power switches are used in a wide variety of applications in order to control power being delivered to a load. As examples, a power switch may comprise a Field Effect Transistor (FET), a bipolar junction transistor (BJT), a gallium nitride (GaN) switch, or a silicon carbide (SiC) switch, or possibly a silicon-controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials. Examples of BJTs may include, but are not limited to, PNP, NPN, heterojunction, or any other type of BJT, or any combination of the same.

Power switches are typically controlled by a driver circuit via pulse modulation (PM) signals, such as pulse width modulation (PWM), pulse frequency modulation (PFM), pulse duration modulation, pulse density modulation, or another type of modulation control signal. Modulation control signals can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or cur-rent fed to a load can be controlled by turning the switch on and off at a fast rate. The longer the switch is on compared to the off periods, the higher the total power supplied to the load. Some types of power switches may be configured to turn ON in response to a gate voltage, and other power switches may be configured to turn OFF in response to a gate voltage. In many applications, two different power switches are configured in a high-side and low-side configuration, and the on/off switching of the two power switches is synchronized in order to deliver the desired power to a switch node positioned between the high-side and low-side switch.

A processor, such as a microprocessor, or other clock-based processing circuit may provide control signals to the driver circuits in order to control the driver circuits. Moreover, in many situations, driver circuits may include a galvanic isolation barrier that galvanically isolates a low-voltage domain associated with the processor from a high-voltage domain associated with the power switch.

SUMMARY

In general, this disclosure describes circuits and techniques for identifying potential problems with control signals for power switches. More specifically, this disclosure describes the use of registers, e.g., volatile or non-volatile storage elements, configured to count the rising and/or falling edges of pulse modulation (PM) signals within driver circuits or other control circuits.

A processor, for example, may provide PM control signals to a driver circuit, and the driver circuit may generate PM drive signals based on the PM control signals. By counting the edges of PM signals, undesirable changes or errors in the PM signals may be identified. For example, if the counts associated with PM control signals do not match the counts associated with PM drive signals, this may indicate a problem with one or more circuit elements within a driver circuit. In some cases, counter mismatch may be identified (e.g., by reading and comparing the registers) after an actual circuit failure in order to help identify or diagnose the cause of the circuit failure, or in other cases, counter mismatch may be identified within a driver circuit as a potential indicator of existing PM signaling problems that could lead to future circuit failure.

In some examples, this disclosure describes a driver circuit configured to control a power switch. The driver circuit may comprise an input pin configured to receive PM control signals from a processor, and an output pin galvanically isolated from the input pin, wherein the driver circuit is configured to deliver PM drive signals from the output pin to the power switch to control ON/OFF switching of the power switch. According to this disclosure, the driver circuit may also comprise a register configured to store counts associated with the PM drive signals.

In some examples, this disclosure describes a method of controlling a power switch. The method may comprise receiving PM control signals from a processor via an input pin of a driver circuit, delivering PM drive signals from an output pin of the driver circuit to the power switch to control ON/OFF switching of the power switch, and storing counts associated with the PM drive signals in a register associated with the driver circuit.

In some examples, this disclosure describes a system comprising a processor, a power switch, and a driver circuit configured to control the power switch. The driver circuit may comprise an input pin configured to receive PM control signals from the processor, an output pin galvanically isolated from the input pin, wherein the driver circuit is configured to deliver PM drive signals from the output pin to the power switch to control ON/OFF switching of the power switch, and a register configured to store counts associated with the PM drive signals, wherein the register is readable by the processor.

Details of these and other examples are set forth in the accompanying drawings and the description below. Other features, objects, and advantages will be apparent from the description and drawings, and from the claims.

DETAILED DESCRIPTION

Figure 1:
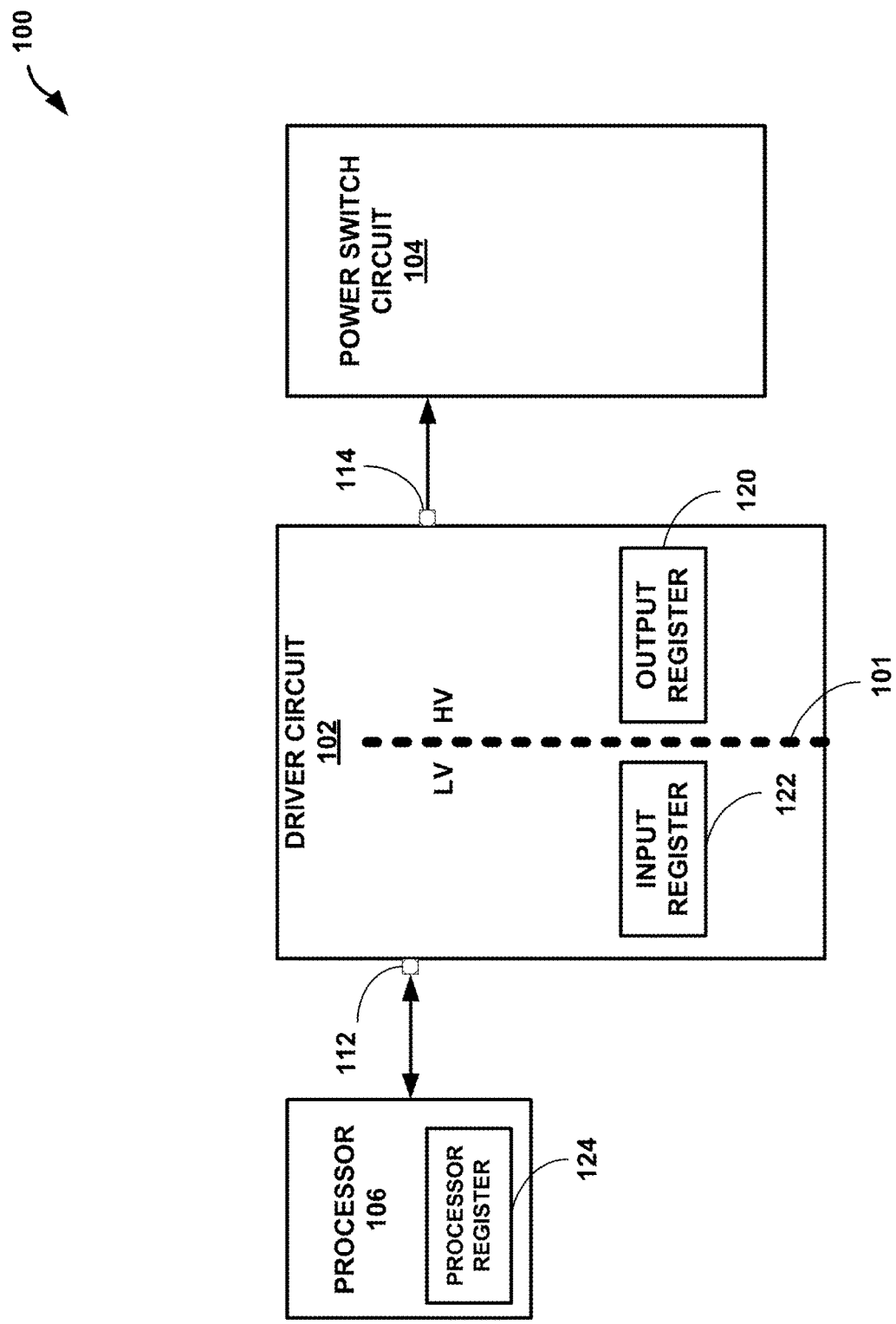
FIG. 1 is a block diagram of a system that comprises a driver circuit configured to control a power switch according to this disclosure.

This disclosure describes circuits and techniques for identifying potential problems with control signals for power switches. More specifically, this disclosure describes the use of registers, e.g., volatile or non-volatile storage elements, configured to count the rising and/or falling edges of pulse modulation (PM) signals within driver circuits or other control circuits. The PM signals may comprise so-called pulse width modulation (PWM) signals, or other types of modulation signals, such as pulse frequency modulation signals, pulse duration modulation signals, pulse density modulation signals, or other types of modulation signals used for the control of power switches.

A processor, for example, may provide PM control signals to a driver circuit, and the driver circuit may generate and output PM drive signals to a power switch, wherein the PM drive signals are based on the PM control signals. By counting the edges of PM signals (e.g., rising and falling edges), undesirable changes or errors in the PM signals may be identified. For example, if the counts associated with PM control signals do not match the counts associated with PM drive signals, this may indicate a problem with one or more circuit elements within a driver circuit. In some cases, registers may be used to track the PM signals in many different circuit locations within a power switch system.

In some cases, counter mismatch may be identified (e.g., by reading and comparing the content of two or more different registers) after an actual circuit failure, in order to help identify or diagnose the cause of the circuit failure. In other cases, counter mismatch may be identified within a driver circuit as a potential indicator of PM signaling problems that could lead to a future circuit failure. Thus, in some cases, a driver circuit may be configured to react to counter mismatch, such as by disabling operation, limiting operation of a power switch, or sending an alert to the processor. Accordingly, in some cases, the driver circuit or the processor that sends the PM control signals to the drier circuit may be configured to immediately react to counter mismatch. In other examples, however, the data stored in registers may be stored for use or analysis after device failure, e.g., for read-out by a technician, in order to help identify the cause of the device failure or the location within the circuit where PM signals may have been compromised.

Analysis of circuit failures has shown that undesirable problems can sometimes manifest in PM signals within a power switch circuit system. PM signaling problems may be caused for a variety of reasons, such as circuit problems, circuit layout problems, poor circuit design, circuit noise, problems with a printed circuit board (PCB), circuit substrate issues, the positioning of circuit elements within a circuit system, or other reasons. Circuit problems may also be caused by aging of the effects of circuit elements, or excessive heat in the circuit, or possibly environmental exposure. For these and other reasons, it is often desirable to monitor circuit parameters in one or more circuit locations. For example, aging of DC-link capacitors or aging of ceramic capacitors for signal filters can cause issues with PM signals. Moreover, overly hot electrons in a MOSFET trench bottom can sometimes lead to undesirable increases in switching speed.

Backchannel communication within a circuit may be desirable to communicate circuit information, circuit signals, or circuit operational parameters over a galvanic isolation barrier. In many situations, for example, driver circuits may include a galvanic isolation barrier that galvanically isolates a low-voltage domain associated with the processor from a high-voltage domain associated with the power switch. In such systems, backchannel communication may facilitate communication across the galvanic isolation barrier, such as by using optical signals, data communication over a secondary transformer, communication over a primary transformer when PM signals are disabled, or other techniques. Real-time back-channel communication is sometimes desirable in driver circuits. Real-time backchannel communication may refer to backchannel communication that is synchronous with PM signaling.

Backchannel communication and especially real-time backchannel communication, however, can be costly from a circuit standpoint, often requiring additional circuit pins or elements to facilitate such communication over the galvanic isolation barrier. In many cases, microcontrollers are positioned on different circuit boards than power switch gate driver circuits, in which case large connectors may be needed. Circuit packages are also pinning limited. More pins in circuit packages may result in a higher pin pitch, which may require higher cleanliness requirements in circuit production lines. Backchannels may also require insulation in some circuits, which further increases circuit costs.

Moreover, in situations where a forward channel exhibits circuit noise, the backchannel may exhibit the same problems. Filtering can sometimes make it challenging for a backchannel to accurately identify or communicate circuit events in real time, e.g., synchronous with PM signaling. In some examples, rather than real-time gate monitoring over a galvanic isolation barrier, this disclosure implements a circuit tracking scheme that counts and records circuit events for later readout or analysis, e.g., when PM signals are disabled or possibly after a circuit has failed.

FIG. 1 is a block diagram of a system 100 that comprises a driver circuit 102 configured to control a power switch circuit 104 according to this disclosure. Power switch circuit 104 may comprise a power transistor. In the example of FIG. 1, the power transistor within power switch circuit 104 may comprise an insulated gate bipolar transistor (IGBT), or a metal-oxide-semiconductor field effect transistor (MOSFET). The MOSFET may be formed in silicon, in which case the MOSFET may be called a silicon MOSFET. Alternatively, the MOSFET may be formed in another semiconductor material, such as silicon carbide (SiC) or gallium nitride (GaN), in which case the MOSFET may be called a SiC MOSFET or a GaN MOSFET.

Driver circuit 102 may comprise a galvanic isolation barrier 101 that separates a first voltage domain (e.g., a low voltage IV' domain) from a second voltage domain (e.g., a high voltage 'HV' domain). Galvanic isolation barrier 101, for example, can be implemented with one or more coiled transformers, one or more coreless transformers, one or more capacitors, or other elements that are capable of galvanically isolating two different voltage domains within driver circuit 102.

Driver circuit 102 may comprise an input pin 112 configured to receive PM control signals from a processor 106. Driver circuit 102 may also comprise an output pin 114 galvanically isolated from the input pin 112, wherein the driver circuit is configured to deliver PM drive signals from the output pin 114 to a power switch (e.g., power switch circuit 104) to control ON/OFF switching of the power switch. An output register 120 of driver circuit 102 may be configured to store counts associated with the PM drive signals. In this way, driver circuit 102 can store at least a partial history of the PM drive signals applied to power switch circuit 104, e.g., for later readout.

In some examples, a plurality of registers may be used throughout system 100 to track PM signals at different circuit locations, which can facilitate comparisons amongst the PM signals at the different locations. In the example of FIG. 1, driver circuit includes both a first register, i.e., output register 120, configured to store counts of PM drive signals, and a second register, i.e., an input register 122, configured to store counts of PM control signals received from processor 112. Moreover, processor 106 may comprise yet another register, i.e., processor register 124 configured to store counts of the PM control signals sent by processor 112. By comparing the contents of two or more of registers 120, 122, or 124, counter mismatch can be identified to indicate a potential PM signaling problem within system 100.

As noted above, in some cases, counter mismatch may be identified (e.g., by reading and comparing the content of two or more different registers of system 100) after an actual circuit failure, in order to help identify or diagnose the cause of the circuit failure. In other cases, counter mismatch may be identified within driver circuit 102, e.g., by periodically comparing the content of output register 120 and input register 122, as a potential indicator of PM signaling problems that could lead to a future circuit failure. Thus, in some cases, driver circuit 102 may be configured to react to counter mismatch, such as by disabling operation or limiting operation of power switch circuit 104 or by communicating an alert to processor 112. In other examples, however, the data stored in registers 120, 122, and 124 may be stored for use or analysis after device failure, e.g., for read-out by a technician, in order to help identify the cause of the device failure or the location within the circuit where PM signals may have been compromised.

In general, registers 120, 122, and 124 may each comprise volatile or non-volatile memory or other storage elements, and the memory may be readable by processor 106. Output register 120, in some examples, may include a back-channel connection across galvanic isolation barrier 101 to facilitate readout by processor 106. In some examples according to this disclosure, backchannel communication may be used to facilitate readout of output register 120, but this backchannel communication may be non-real-time in the sense that the communication is slower than PM signaling and non-synchronous with PM signaling, which can help avoid complexities and challenges associated with real-time back channel communication. Input register 122 and processor register 124 may be connected to and readable by processor 106.

In some examples, output register 120 and input register 122 of driver circuit 102 comprise non-volatile memory that is readable by processor 106 when the PM drive signals are disabled. In some examples, each of registers 120, 122, and/or 124 may comprise so-called an overflow register that is configured to store counts in an overflowing manner, possibly storing least significant bits. Overflow registers may be useful to help limit the size of the registers and can provide an indicator of mismatch in counts between the registers without requiring an actual account of millions of switching events. Overflow registers may be configured to store N bits of data in a first in first out (FIFO) manner. 8-bit registers may be sufficient to achieve tracking of counter mismatch, e.g., storing least significant bits. In some examples, N may represent any integer greater than 3 and less than 17.

The registers, e.g., each of registers 120, 122, and 124, may comprise counters that count a number of rising edges and falling edges of the PM signals. In some implementations, the counters could be configured to count only the rising edges or only the falling edges, but counts of both rising and falling edges is usually desirable.

Figure 2:
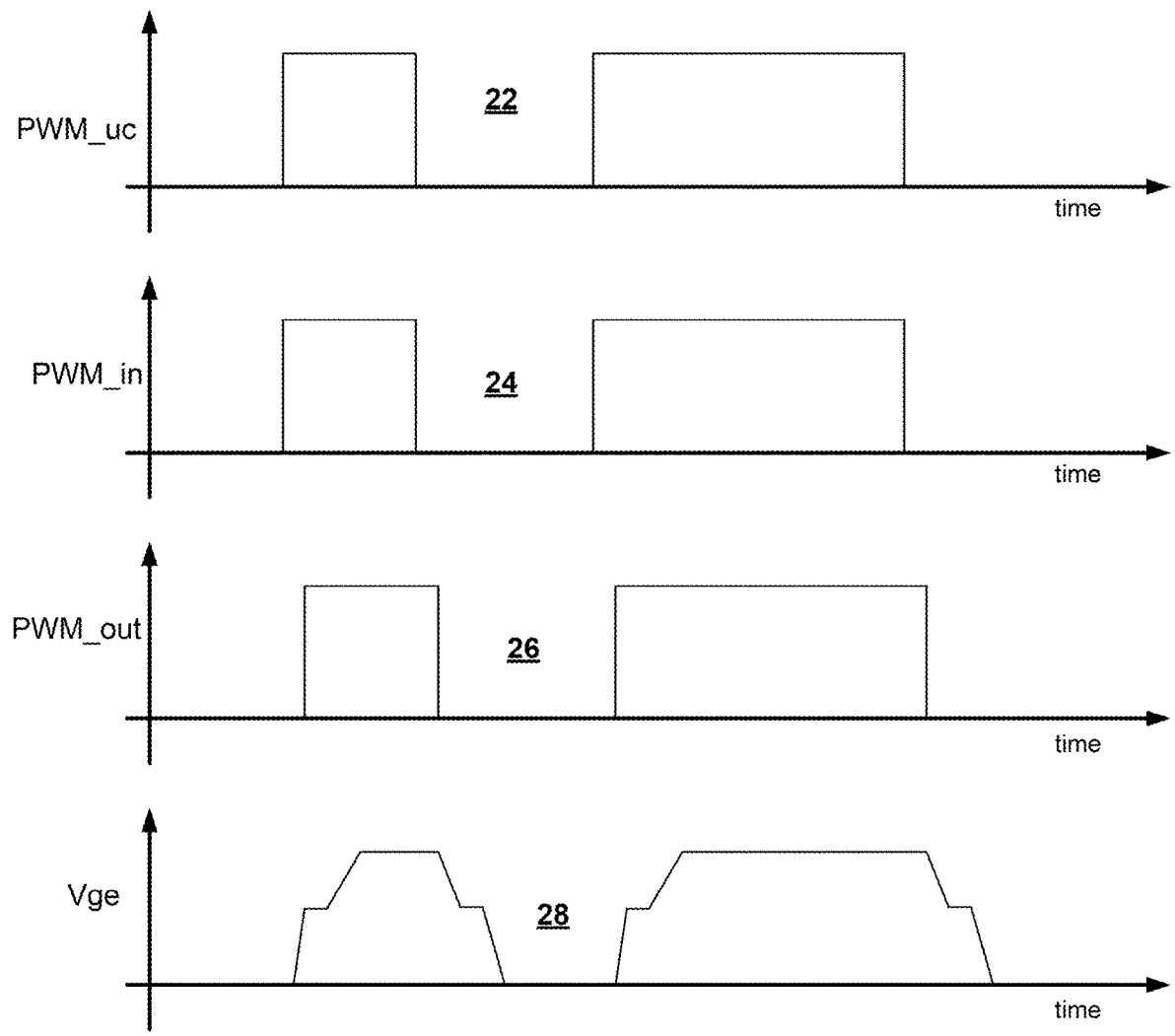
FIG. 2 is an illustration of four graphs showing different exemplary signals associated with power switch control.

FIG. 2 is an illustration of four graphs showing different exemplary signals associated with power switch control. PM signals 22 may comprise PWM control signals sent from a microcontroller. PM signals 24 may comprise the corresponding PWM control signals received by a driver circuit. PM signals 22 and 24 are similar (and have the same number of rising and falling edges) meaning that no signaling problem exists. The details of FIG. 2 and other examples of this disclosure are generally described with regard to power switches that are normally in an OFF state, where a gate voltage turns the power switch ON. Of course, the same principles of this disclosure may also be used for drivers of power switches that are normally in an ON state, where a gate voltage turns the power switch OFF.

PM signals 26 may comprise PWM drive signals within a driver circuit, e.g., those sent from the driver circuit to a gate of a power switch. PM signals 26 and 24 are similar (and have the same number of rising and falling edges) meaning that no signaling problem exists. A slight delay may exist between PM signals 26 relative to PM signals 24 due to signal delay through the driver circuit. Signal 28 may comprise the voltage drop over the power switch, e.g., the gate to emitter voltage, caused with PM signal 26 is applied to the gate of the power switch. Signal 28 generally corresponds to signal 26, but signal 28 may include slopes in the turn-on and turn-off of the power switch, and may also include so-called "Miller" plateaus associated with power switch operation. The four graphs in FIG. 2 may generally represent signals associated with normal switch operation, without any signaling problems.

Figure 3:
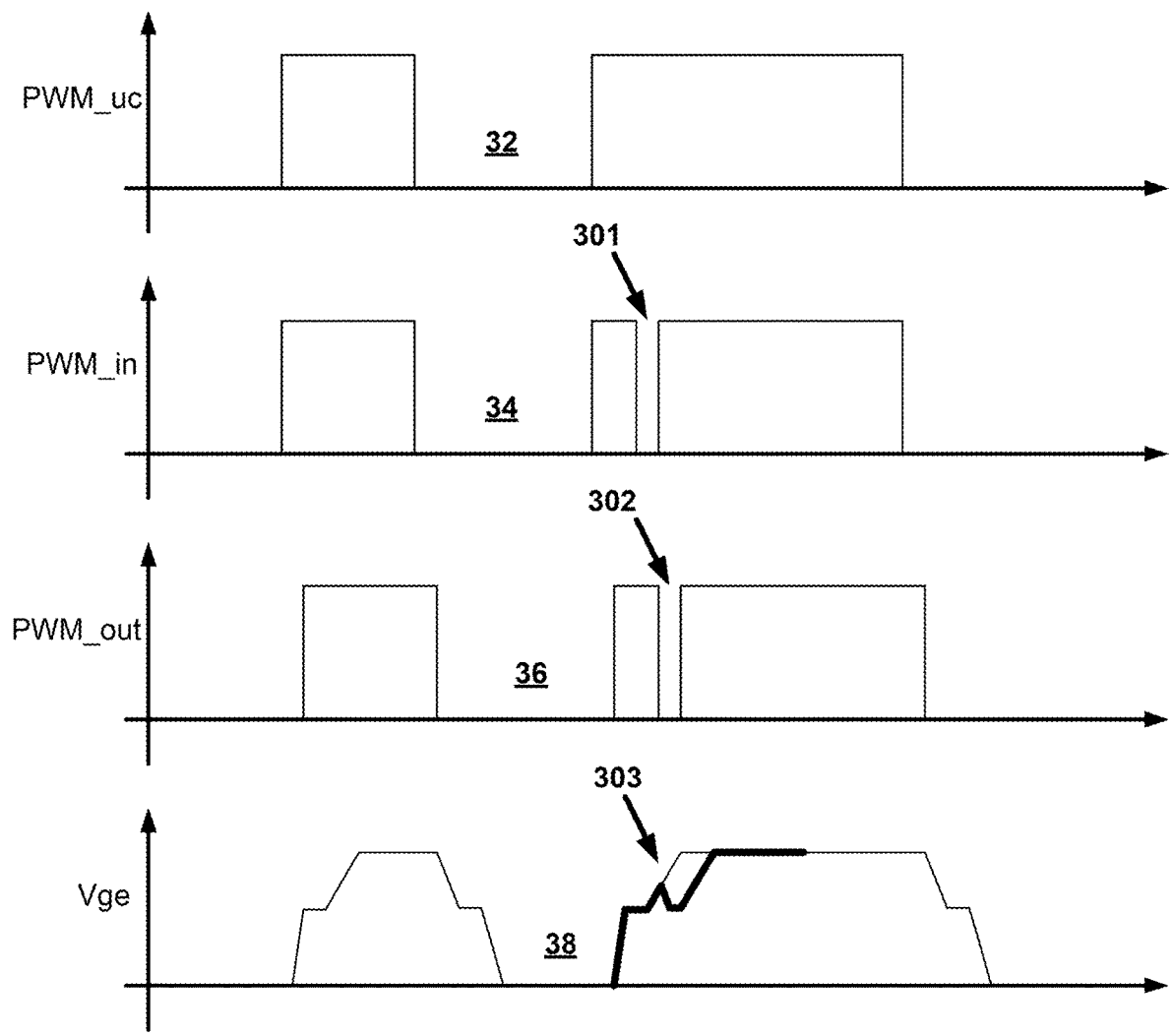
FIG. 3 is another illustration of four graphs showing different exemplary signals associated with power switch control.

FIG. 3 is another illustration of four graphs showing different exemplary signals associated with power switch control. PM signals 32 may comprise PWM control signals sent from a microcontroller. PM signals 34 may comprise the corresponding PWM control signals received by a driver circuit. PM signals 22 and 24 are dissimilar (and have different numbers of rising and falling edges) meaning that a signaling problem may exist, e.g., due to glitch 301.

PM signals 36 may comprise PWM drive signals within a driver circuit, e.g., those sent from the driver circuit to a gate of a power switch. PM signals 36 and 34 are similar (and have the same number of rising and falling edges) meaning that glitch 302 is present. A slight delay may exist between PM signals 36 relative to PM signals 34 due to signal delay through the driver circuit. Signal 38 may comprise the voltage drop over the power switch, e.g., the gate to emitter voltage, caused with PM signal 36 is applied to the gate of the power switch. Signal 38 may include slopes in the turn-on and turn-off of the power switch and may also include so-called "Miller" plateaus associated with power switch operation. Because of glitches 301 and 302, signal 38 may include undesirable signal artifact 303, which can put undesirable stress on the power switch. The four graphs in FIG. 3 may generally represent signals associated with switch operation, in the presence of a signaling problem, possibly of unknown cause. Thus, by tracking and counting edges of PM signals, counter mismatch may be used to identify the existence of glitches 301 and 302.

The signal monitoring and counting techniques of this disclosure may have benefits relative to direct gate monitoring of a power switch. In this case, the root cause of errors can be more easily identified, and the relative independence of different signals can be compared. In some examples, such counters can be used merely for debugging purposes, without use in the field, although the use of counters to track circuit performance in the field is often desirable according to this disclosure. Counting registers may be very inexpensive to implement within a gate driver circuit system, and in some cases, memory may already be available for other reasons at one or more of the different circuit locations.

Power switch circuits may fail for reasons unrelated to power switch or the gate driver circuits Failures, for example, can be caused by circuit noise or undesirable circuit layout, and customers may experience circuit failures without evidence that the PWM signals sent to the power switch were actually correct. Such situations can be frustrating to customers and to circuit suppliers where circuits fail without a way to identify the cause of failure.

According to this disclosure, gate driver circuits and other circuits associated with power switch control (such as the microcontroller that sends control signals to the gate driver circuit) may include pulse counters, e.g., pulse count registers, to track and store indications of rising and falling edges of PM signals. A microcontroller may count each PWM pulse at the microcontroller output, and a gate driver input may similarly count each PWM pulse at the gate driver input. Moreover, the gate driver may count each PWM pulse at the gate driver output and possibly at other locations, such as on a gate clamp pin.

The count registers may be readable by microcontroller, such as when PM signals are disabled. PM signals may be viewed as being disabled any time PM signals are not being sent or when a driver signal is not enabled, such as via an enable signal on a separate pin. In some examples, a processor may readout a DUMP failure report as part of a failure analyzes. Readout of count registers may be performed at any time the driver is not active, such as at stop operation (e.g., Enable=Low) or possibly during down time when PM signal are not being sent or received by the driver circuit. In some examples, counter mismatch can be used by circuits or technicians to help pinpoint the cause of errors or the cause of device failure.

Figure 4:
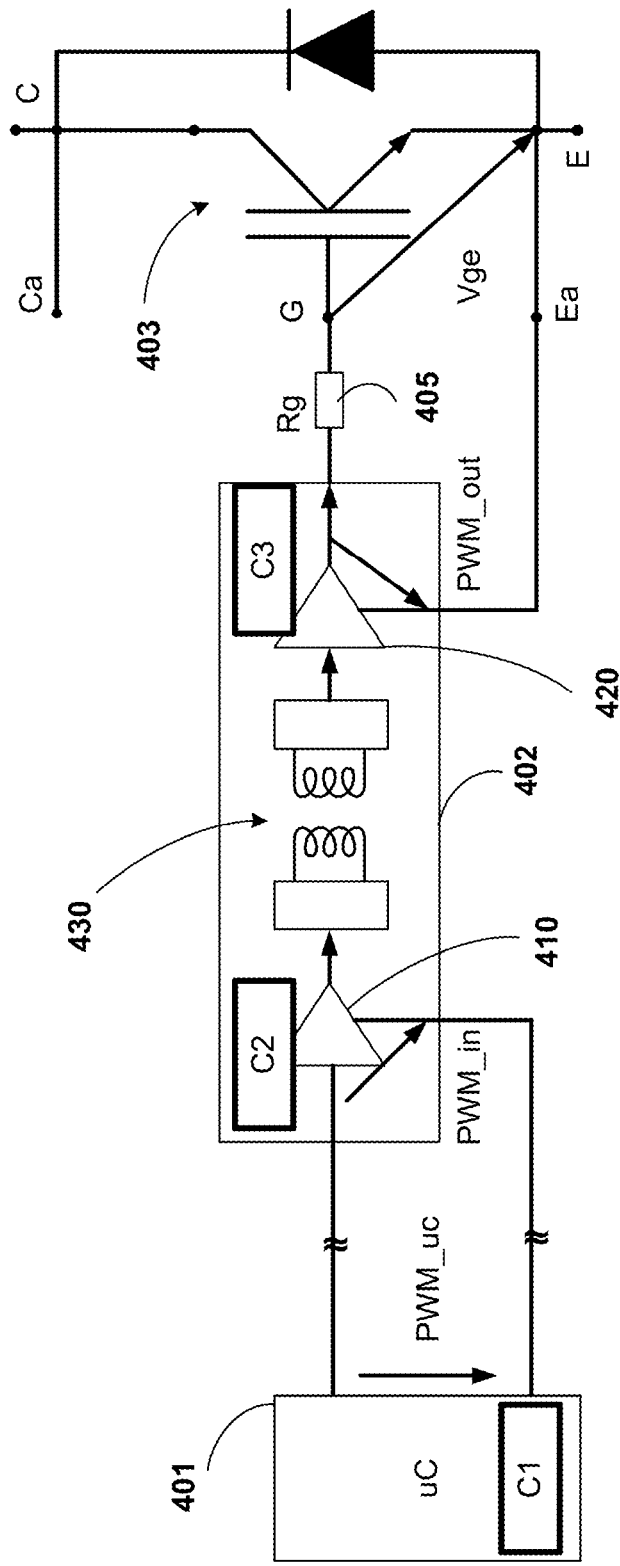
FIG. 4 is circuit diagram showing a system consistent with this disclosure.

FIG. 4 is a circuit diagram of a system that comprises a driver circuit 402 configured to control a power switch circuit 403 according to this disclosure. Driver circuit 402 may comprise a galvanic isolation barrier 430 that separates a first voltage domain (e.g., a low voltage domain associated with processor 401) from a second voltage domain (e.g., a high voltage domain associated with power switch circuit 403). Galvanic isolation barrier 430, for example, can be implemented with one or more coiled transformers, one or more coreless transformers, one or more capacitors, or other elements that are capable of galvanically isolating two different voltage domains within driver circuit 402.

Driver circuit 402 may comprise an input pin configured to receive PM control signals (PWM_in) from a processor 401. One or more input elements 410, such as amplifiers, filters, or other signal conditioning components may filter, amplify, or otherwise condition the received input, e.g., to remove unwanted noise. Driver circuit 402 may also comprise an output pin galvanically isolated from the input pin, wherein the driver circuit is configured to deliver PM drive signals (PWM_out) from the output pin to a gate of a power switch circuit 403 to control ON/OFF switching of the power switch. One or more output elements 420, such as amplifiers, filters, or other signal conditioning components may filter, amplify, or otherwise condition the signals, e.g., to remove unwanted noise. A gate resistor 405 may be included between driver circuit 402 and power switch circuit 403. An output counter (C3) may comprise a storage register configured to store counts associated with the PM drive signals. In this way, driver circuit 402 can store at least a partial history of the PM drive signals applied to power switch circuit 403, e.g., for later readout.

The system of FIG. 4 may include a plurality of counters to track PM signals at different circuit locations, which can facilitate comparisons amongst the PM signals at the different locations. In the example of FIG. 4, driver circuit includes both an output counter (C3) configured to store counts of PM drive signals, and an input counter (C2), i.e., an input register configured to store counts of PM control signals received from processor 401. Moreover, processor 401 may comprise yet another register, i.e., processor counter (C1) configured to store counts of the PM control signals sent by processor 401. By comparing the contents of two or more of counters C1, C2 and/or C3, counter mismatch can be identified to indicate a potential PM signaling problem within the system.

Figure 5:
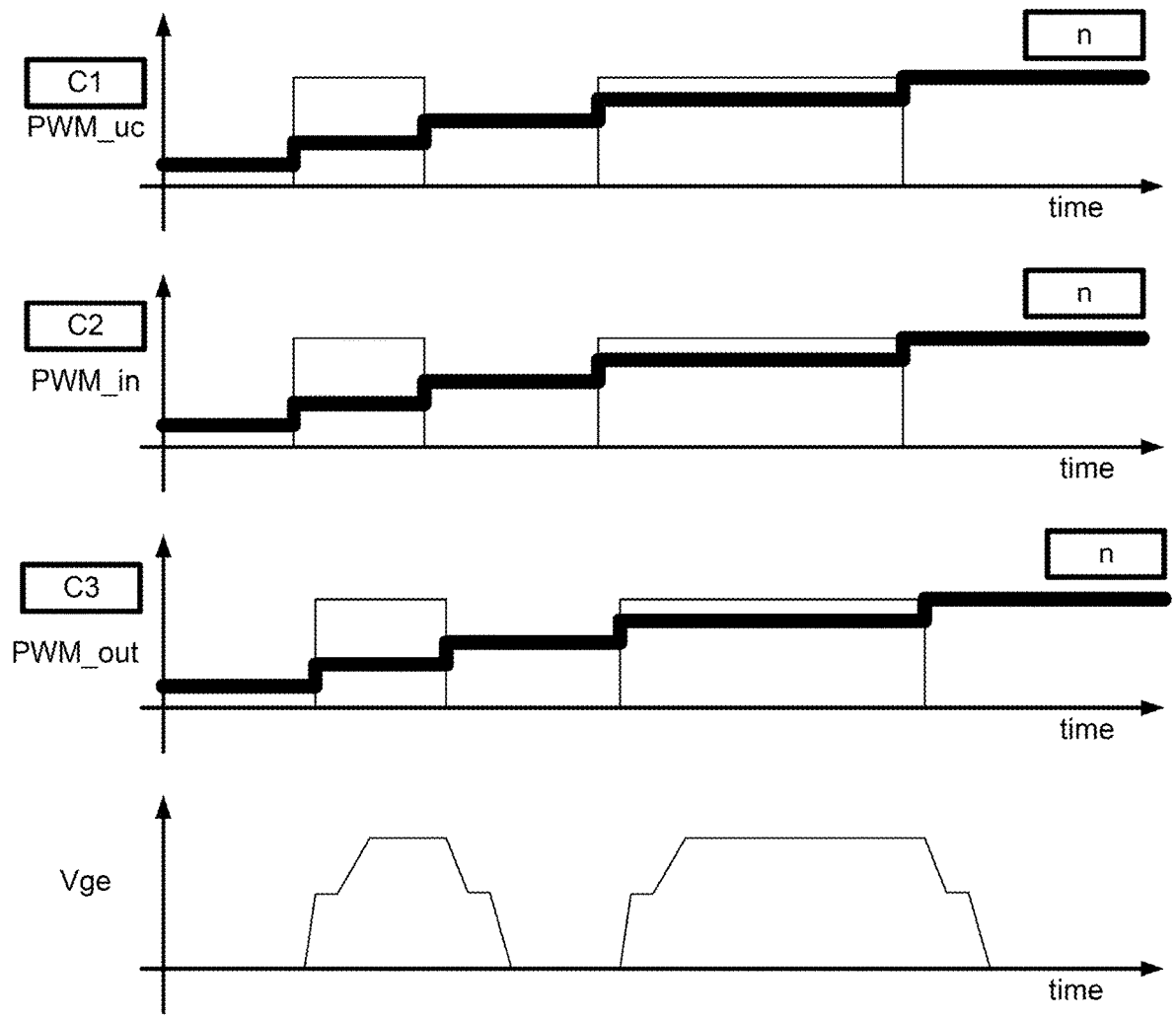
FIG. 5 is another illustration of four graphs showing different exemplary signals associated with power switch control, and counts associated with some of the graphs.

FIG. 5 is another illustration of four graphs showing different exemplary signals associated with power switch control, and counts associated with some of the graphs. FIG. 5 is similar to FIG. 2, but FIG. 5 also shows counters C1, C2, and C3, which may correspond to counters C1, C2, and C3 of FIG. 4. As can be seen in FIG. 5, the counts for C1, C2, and C3 are all the same, i.e., count=n, for each of C1, C2, and C3. In this case, there are no signaling problems within the system.

Figure 6:
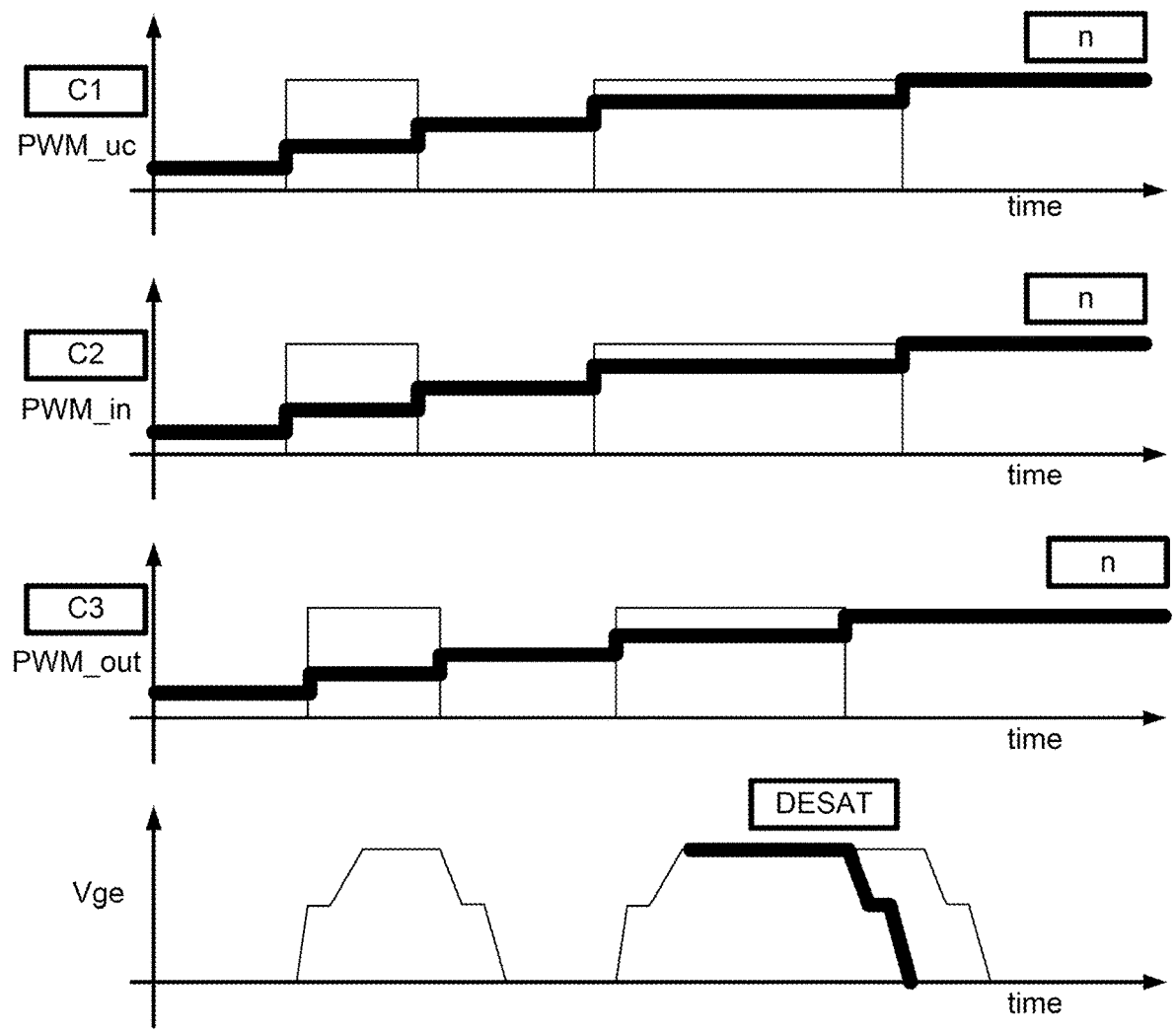
FIG. 6 is another illustration of four graphs showing different exemplary signals associated with power switch control, and counts associated with some of the graphs.

FIG. 6 is another illustration of four graphs showing different exemplary signals associated with power switch control, and counts associated with some of the graphs. FIG. 6 is similar to FIG. 5, except in FIG. 5, the PWM_out signal is terminated early, e.g., due a desaturation (DESAT) event. Accordingly, the Vge signal is also terminated early (as shown in bold) due to the DESAT event. The counters shown in FIG. 6, i.e., C1, C2, and C3, which may correspond to counters C1, C2, and C3 of FIG. 4 are all in sync, similar to FIG. 5. In other words, as can be seen in FIG. 6, the counts for C1, C2, and C3 are all the same, i.e., count=n, for each of C1, C2, and C3. In this case, there are no signaling problems within the system. The DESAT event does not affect the counts, but merely the timing of when the counts may occur.

Figure 7:
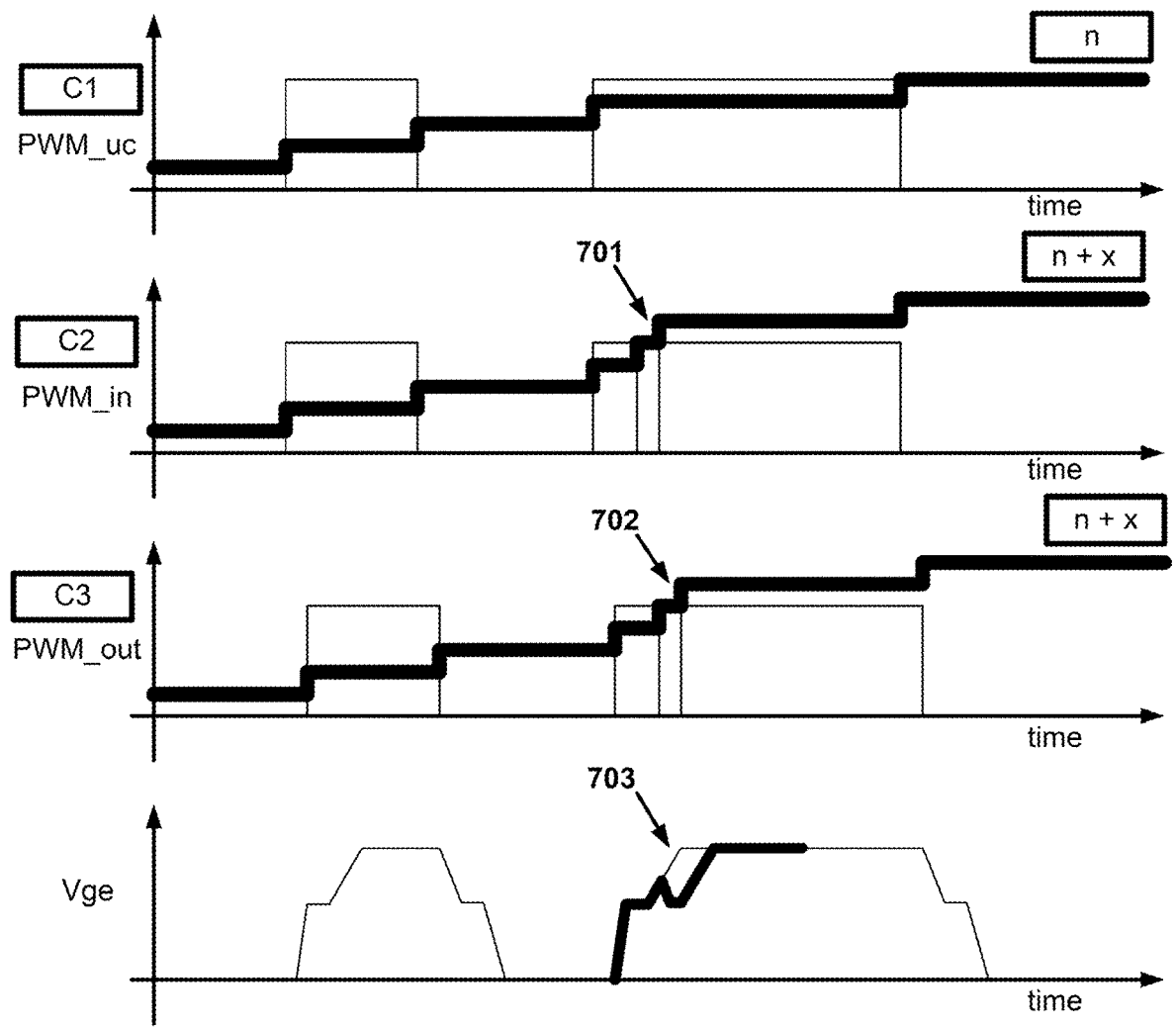
FIG. 7 is another illustration of four graphs showing different exemplary signals associated with power switch control, and counts associated with some of the graphs.

FIG. 7 is another illustration of four graphs showing different exemplary signals associated with power switch control, and counts associated with some of the graphs. FIG. 7 is similar to FIG. 3, but FIG. 7 also shows counters C1, C2, and C3, which may correspond to counters C1, C2, and C3 of FIG. 4. As can be seen in FIG. 7, the counts for C1 are different than the counts for C2 and C3, i.e., count=n for C1 and count=n+x for C2 and C3. In this case, there is a signaling problems within the system. The glitch at positions 701 and 702 cause extra counts by C2 and C2, and result in unwanted artifact in Vge over the power switch, as shown at 703.

Figure 8:
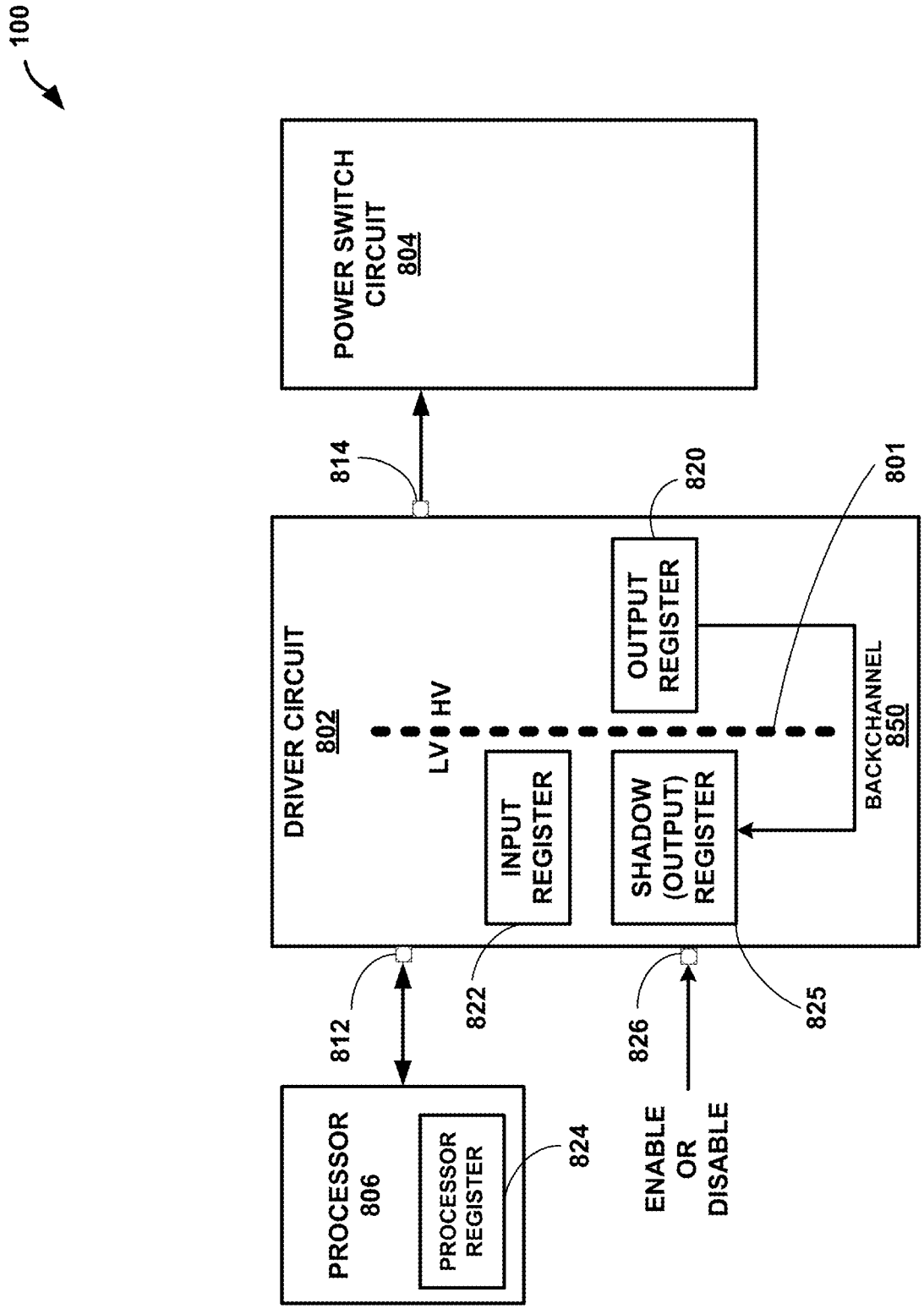
FIG. 8 is another block diagram of a system that comprises a driver circuit configured to control a power switch according to this disclosure.

FIG. 8 is a block diagram of a system 800 that comprises a driver circuit 802 configured to control a power switch circuit 804 according to this disclosure. Driver circuit 802 may comprise a galvanic isolation barrier 801 that separates a first voltage domain (e.g., a low voltage IV' domain) from a second voltage domain (e.g., a high voltage 'HV' domain). Galvanic isolation barrier 801, for example, can be implemented with one or more coiled transformers, one or more coreless transformers, one or more capacitors, or other elements that are capable of galvanically isolating two different voltage domains within driver circuit 802.

Driver circuit 802 may comprise an input pin 812 configured to receive PM control signals from a processor 806. Driver circuit 802 may also comprise an output pin 814 galvanically isolated from the input pin 812, wherein the driver circuit is configured to deliver PM drive signals from the output pin 814 to a power switch (e.g., power switch circuit 804) to control ON/OFF switching of the power switch within power switch circuit 804. An output register 820 of driver circuit 802 may be configured to store counts associated with the PM drive signals. In this way, driver circuit 802 can store at least a partial history of the PM drive signals applied to power switch circuit 804.

In the example of FIG. 8, output register 820 is associated with a corresponding "shadow" output register 825. Whereas output register 820 is located in the high voltage domain, shadow output register 825 is located in the low voltage domain. Shadow output register 825 may store a shadow of output register 820, and shadow output register 825 may be updated with the content of output register 820 via backchannel 850 when driver circuit 802 is disabled or when PM signals are inactive or disabled. In some examples, driver circuit 802 may include an enable pin configured to receive an enable or disable signal from processor 806 or from another system-level component. When driver circuit 802 is disabled or when PM signals are inactive or disabled, shadow output register 825 can be updated to store the content of output register 820. This allows for easy access to the count of PM drive signals being output by driver circuit 802 insofar as shadow output register 825 may be located in the same voltage domain as processor 806 and may be readable by processor 806. In FIG. 8, backchannel 850 is illustrated as being inside driver circuit 802, but in other examples, backchannel 850 may also be external relative to driver circuit 802.

In some examples, shadow output register 825 can be viewed as a first register, input register 822 can be viewed as a second register, and output register 820 can be viewed as a third register. Shadow output register 825 is located in a first voltage domain (i.e., the LV domain) and configured to store a shadow of output register 820 when the PM drive signals are disabled. Input register 822 is galvanically isolated from output register 820, and input register 822 is located in the first voltage domain (i.e., the LV domain) and output register 820 is located in a second voltage domain (i.e., the HV domain).

PM drive signals may be enabled or disabled via an enable pin 826. Enable pin 826 may be configured to receive enable or disable signals from a processor or another circuit. Alternatively, PM drive signals may also be enabled via a driver reset signal or possibly via software running on processor 806. In any case, shadow output register 825 may be updated with the contents of output register 820 in response to the PM drive signals being disabled. Processor 806 can then read output of input register 822 and shadow output register 825 to determine if counter mismatch exists. Processor can also compare the contests of input register 822 and shadow output register 825 with that of processor register 824 to identify any mismatch. In some examples, processor 806 may cause driver circuit 802 to disable operation of power switch circuit 804 in response to mismatch among registers, but in other cases, mismatch among registers may be identified after failure of driver circuit 802 or power switch circuit 804 in order to allow technicians to identify the cause of the failure.

In some examples, a plurality of registers may be used throughout system 800 to track PM signals at different circuit locations, which can facilitate comparisons amongst the PM signals at the different locations. In the example of FIG. 8, driver circuit 802 includes both a first register, i.e., shadow output register 825 configure to store counts of PM drive signals, and a second register, i.e., an input register 822 configured to store counts of PM control signals received from processor 812. Driver circuit 802 also includes a third register, i.e., output register 820. Moreover, processor 806 may comprise yet another register, i.e., processor register 824 configured to store counts of the PM control signals sent by processor 812. By comparing the contents of two or more of registers 825, 822, or 824 (all of which are located in the same voltage domain), counter mismatch can be identified to indicate a potential PM signaling problem within system 800.

Again, in some cases, counter mismatch may be identified (e.g., by reading and comparing the content of two or more different registers of system 800) after an actual circuit failure, in order to help identify or diagnose the cause of the circuit failure. In other cases, counter mismatch may be identified within driver circuit 802, e.g., by periodically comparing the content of shadow output register 825 and input register 822 when PM drive signals are disabled, as a potential indicator of PM signaling problems that could lead to a future circuit failure. Thus, in some cases, driver circuit 802 or processor 806 may be configured to react to counter mismatch, such as by disabling operation or limiting operation of power switch circuit 804. In other examples, however, the data stored in registers 825, 822, and 824 may be stored for use or analysis after device failure, e.g., for read-out by a technician, in order to help identify the cause of the device failure or the location within the circuit where PM signals may have been compromised.

In general, each of registers 820, 822, 824, and 825 may each comprise volatile or non-volatile memory or other storage elements. Some or all of registers 820, 822, 824, and 825 may be readable by processor 806. Output register 820, in some examples, may include a back-channel connection across galvanic isolation barrier 801 to facilitate readout by processor 806. Registers 822, 825 and 824 may be connected to and readable by processor 806. In some examples, output register 820 may be unreadable by processor 806 directly, but shadow output register 825 can periodically store the contents of output register 820 so that the data is accessible to processor 806, e.g., when PM signals are disabled.

In some examples, shadow output register 825 and input register 822 of driver circuit 802 comprise non-volatile memory that is readable by processor 806 when the PM drive signals are disabled. In some examples, each of registers 820, 822, 824, and/or 825 may comprise so-called an overflow register that is configured to store counts in an overflowing manner, possibly storing least significant bits. Overflow registers may be useful to help limit the size of the registers and can provide an indicator of mismatch in counts between the registers without requiring an actual account of millions of switching events. Overflow registers may be configured to store N bits of data in a first in first out (FIFO) manner. 8-bit registers may be sufficient to achieve tracking of counter mismatch, e.g., storing least significant bits. In some examples, N may represent any integer greater than 3 and less than 17.

The registers, e.g., each of registers 820, 822, 824, and 825 may comprise counters that count a number of rising edges and falling edges of the PM signals. In some implementations, the counters could be configured to count only the rising edges or only the falling edges. However, counts of both rising and falling edges is desirable in many situations. Registers located in the low voltage domain may comprise non-volatile memory that is readable by the processor when the PM drive signals are disabled. Registers in the high voltage domain may comprise non-volatile memory that is updated to a corresponding shadow register in the low voltage domain when the PM drive signals are disabled.

Again, in some examples, driver circuit 802 may be configured to disable the PM drive signals in response to identifying a mismatch between the shadow output register 825 and input register 822, following an update to shadow output register 825 with the contents of output register 820. In other examples, register readout may occur after device failure, e.g., by a technician, in order to help diagnose the cause of the device failure.

Figure 9:
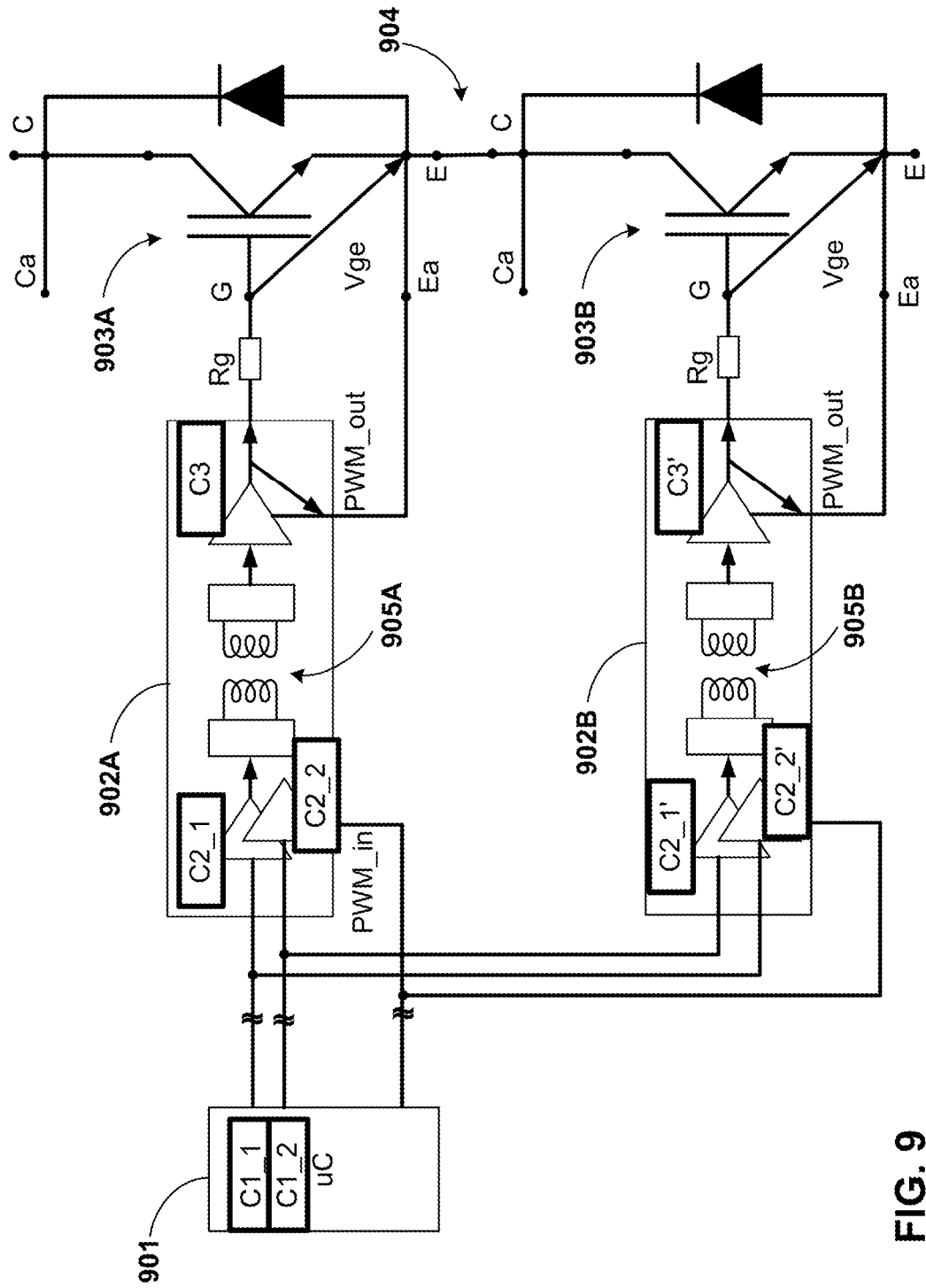
FIGS. 9 and 10 are circuit diagrams showing different circuit systems consistent with this disclosure.

FIG. 9 is another circuit diagram of a system according to this disclosure. The system of FIG. 9 comprises a first driver circuit 902A configured to control a high side power switch circuit 903A according to this disclosure. Moreover, in the system of FIG. 9, a second driver circuit 902B is configured to control a low side power switch circuit 903B. High side power switch circuit 903A and low side power switch circuit 903B may form a half bridge configured to deliver power at a switch node 904 positioned between high side power switch circuit 903A and low side power switch circuit 903B Driver circuits 902A, 902B may each comprise a galvanic isolation barrier 905A, 905B that separates a first voltage domain. Galvanic isolation barriers 905A, 905B, for example, can be implemented with one or more coiled transformers, one or more coreless transformers, one or more capacitors, or other elements that are capable of galvanically isolating two different voltage domains within driver circuits 903A, 903B.

Driver circuits 902A, 902B may each comprise an input pin configured to receive PM control signals (PWM_in) from a processor 901. One or more input elements, such as amplifiers, filters, or other signal conditioning components may filter, amplify, or otherwise condition the received input, e.g., to remove unwanted noise. Driver circuits 902A, 902B may also each comprise an output pin galvanically isolated from the respective input pin, wherein each driver circuit 902A, 902B is configured to deliver PM drive signals (PWM_out) from the respective output pin to a gate of the respective power switch circuit 903A, 903B to control ON/OFF switching of the respective power switch. One or more output elements, such as amplifiers, filters, or other signal conditioning components may filter, amplify, or otherwise condition the output, e.g., to remove unwanted noise. Gate resistors may be included between driver circuit 902A and power switch circuit 903A and between circuit 902B and power switch circuit 903B. Output counters (C3 and C3') may comprise storage registers configured to store counts associated with the PM drive signals for driver 902A and driver 902B. In this way, driver circuits 902A and 902B can each store at least a partial history of the PM drive signals applied to power switch circuits 903A, 903B, e.g., for later readout.

A plurality of counters may be used throughout the system of FIG. 9 to track PM signals at different circuit locations, which can facilitate comparisons amongst the PM signals at the different locations. In the example of FIG. 9, each driver circuit includes both an output counter (C3 and C3') configured to store counts of PM drive signals, and input counters (C2_1, C2-2 and C2_1' and C2_2'), i.e., input registers configured to store counts of PM control signals received from processor 901. In this case, both driver 902A and driver 902B may each receive the input PM control signals for both driver circuits, which can help to ensure that both power switches are not ON simultaneously. Moreover, processor 401 may comprise additional registers, i.e., processor counters (C1_P1 and C1_P2) configured to store counts of the PM control signals sent by processor 901. By comparing the contents of two or more of counters C1_P1, C2-1 and C3_1, counter mismatch can be identified for driver 902A to indicate a potential PM signaling problem within the system. Similarly, by comparing the contents of two or more of counters C1_P2, C2-2 and C3_2, counter mismatch can be identified for driver 902B to indicate a potential PM signaling problem within the system.

Figure 10:
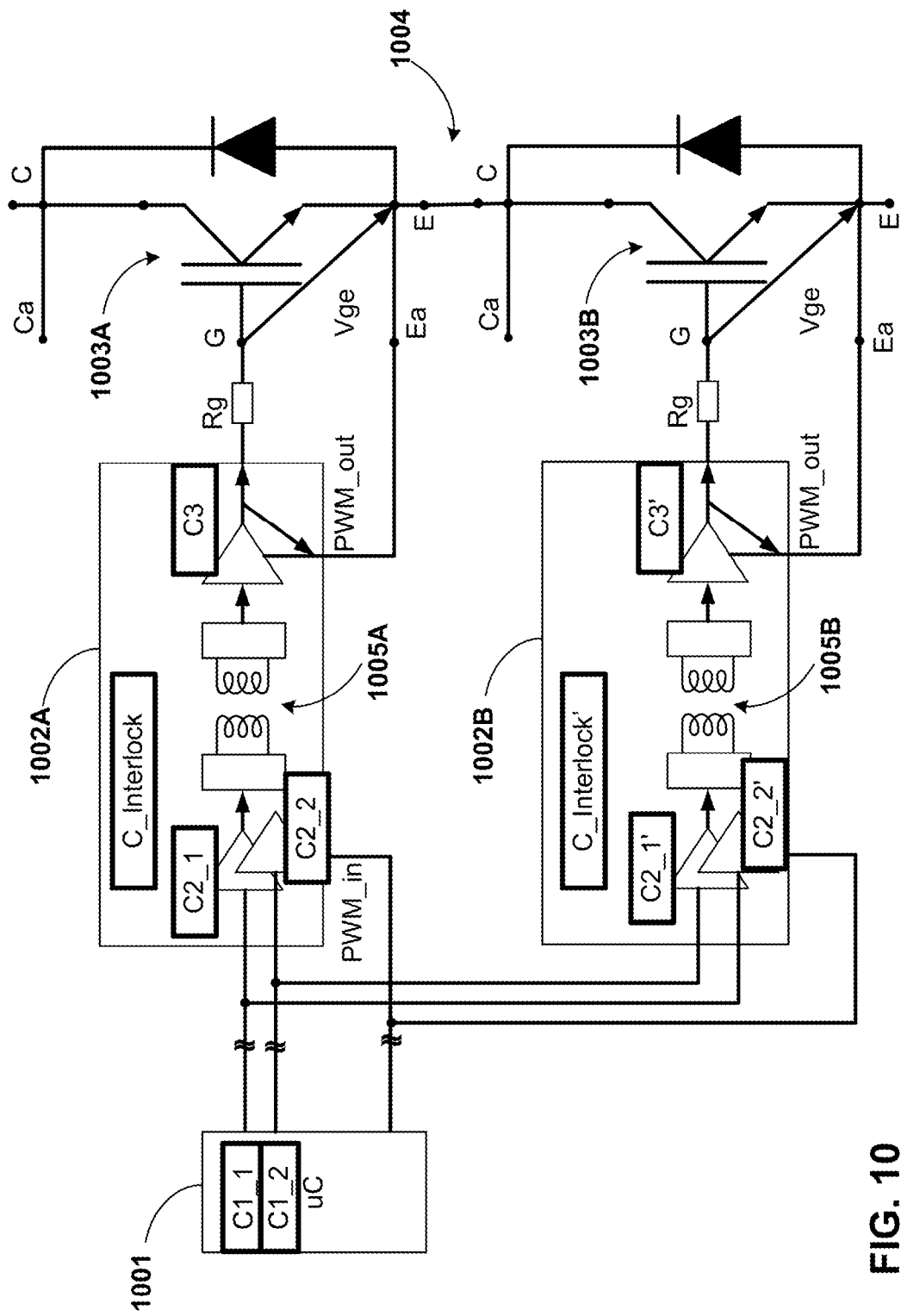

FIG. 10 is another circuit diagram of a system according to this disclosure. FIG. 10 is similar to FIG. 9 in many respects. The system of FIG. 1 comprises a first driver circuit 1002A configured to control a high side power switch circuit 1003A according to this disclosure. Moreover, in the system of FIG. 9, a second driver circuit 1002B is configured to control a low side power switch circuit 1003B. High side power switch circuit 1003A and low side power switch circuit 1003B may form a half bridge configured to deliver power at a switch node 1004 positioned between high side power switch circuit 1003A and low side power switch circuit 1003B Driver circuits 1002A, 1002B may each comprise a galvanic isolation barrier 1005A, 1005B that separates a first voltage domain. Galvanic isolation barriers 1005A, 1005B, for example, can be implemented with one or more coiled transformers, one or more coreless transformers, one or more capacitors, or other elements that are capable of galvanically isolating two different voltage domains within driver circuits 1003A, 1003B.

Driver circuits 1002A, 1002B may each comprise an input pin configured to receive PM control signals (PWM_in) from a processor 1001. One or more input elements, such as amplifiers, filters, or other signal conditioning components may filter, amplify, or otherwise condition the received input, e.g., to remove unwanted noise. Driver circuits 1002A, 1002B may also each comprise an output pin galvanically isolated from the respective input pin, wherein each driver circuit 1002A, 1002B is configured to deliver PM drive signals (PWM_out) from the respective output pin to a gate of the respective power switch circuit 1003A, 1003B to control ON/OFF switching of the respective power switch. One or more output elements, such as amplifiers, filters, or other signal conditioning components may filter, amplify, or otherwise condition the output, e.g., to remove unwanted noise. Gate resistors may be included between driver circuit 1002A and power switch circuit 1003A and between circuit 1002B and power switch circuit 1003B. Output counters (C3 and C3') may comprise storage registers configured to store counts associated with the PM drive signals for driver 1002A and driver 1002B. In this way, driver circuits 1002A and 1002B can each store at least a partial history of the PM drive signals applied to power switch circuits 1003A, 1003B, e.g., for later readout.

A plurality of counters may be used throughout the system of FIG. 10 to track PM signals at different circuit locations, which can facilitate comparisons amongst the PM signals at the different locations. The counters C1_P1, C1_P2, C2_1, C2_2, C2_1', C2_1', C3, and C3' are similar to those shown in FIG. 9 and may operate in the manner explained above in relation to FIG. 9. In addition, driver circuits 1002A and 1002B may each include a so-called interlock counter. For example, driver circuit 1002A includes counter C Interlock, and driver circuit 1002B includes counter C_Interlock'. The interlock counters may be configured to count instances where the high side PM signals and the low side PM signals are both simultaneously high. The details of this disclosure are generally described with regard to power switches that are normally in an OFF state, where a gate voltage turns the power switch ON. Of course, interlock counters may also be configured to count the ON state of power switches that are normally in the ON state, where the gate voltage turns the power switch OFF.

Figure 11A:
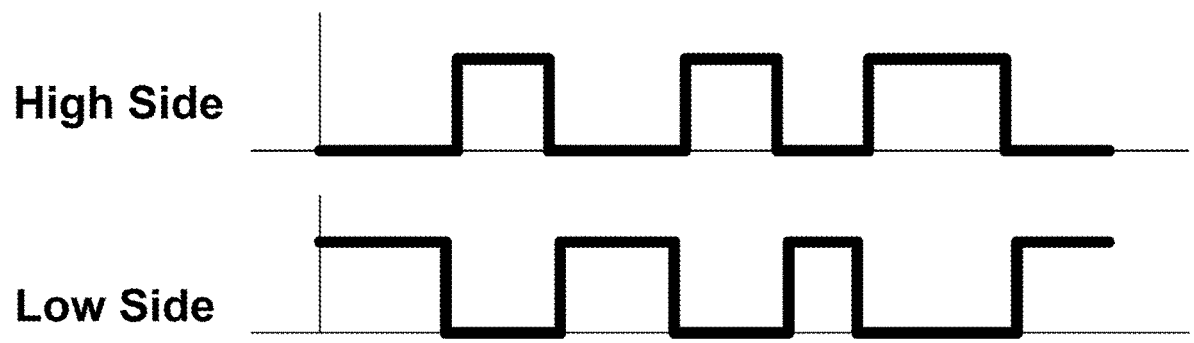
FIGS. 11A and 11B are sets of graphs showing switching associated with two different switches arranged in half bridges.
Figure 11B:
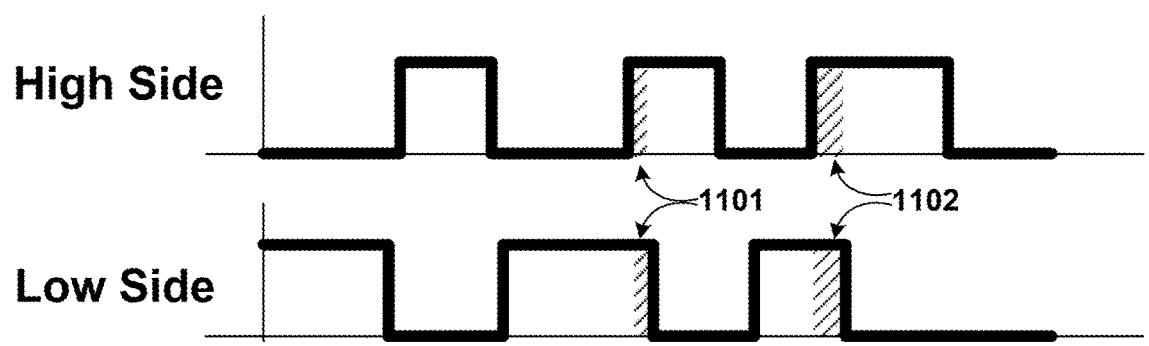

FIG. 11A is a depiction of high side and low side PM signals, which may correspond to PM control signals or PM drive signals. As shown in FIG. 11A, high side and low side PM signals are generally complementary in the sense that high side is ON when low side is OFF and low side is ON when high side is OFF. Sometimes, however, problems can occur in which both high side and low side PM signals are ON simultaneously, e.g., possibly for short periods. FIG. 11B illustrates a possible situation where high side and low side PM signals are ON simultaneously (as shown at positions 1101 and 1102). Interlock counters (C_Interlock and C_Interlock') may be configured to count instances where the high side PM signals and the low side PM signals are both simultaneously high, such as instances shown at locations 1101 and 1102. Interlock counters (C_Interlock and C_Interlock') may include signal logic to identify these situations in the PM control signals. Alternatively, in some cases, interlock circuitry may already exist within the driver circuit to ensure that PM drive signals do not simultaneously activate both power switch circuits 1103A, 1103B. If interlock circuitry already exists in the driver circuits, then interlock counters (C_Interlock and C_Interlock') may be configured to count instances where the interlock circuitry is activated. In addition to the counting of PM control signals and PM drive signals, counting instances of interlock or instances where PM control signals overlap, such as shown at locations 1101 and 1102 of FIG. 11B can be helpful for diagnosing circuit problems in driver circuits 1002A and 1002B.

Figure 12:
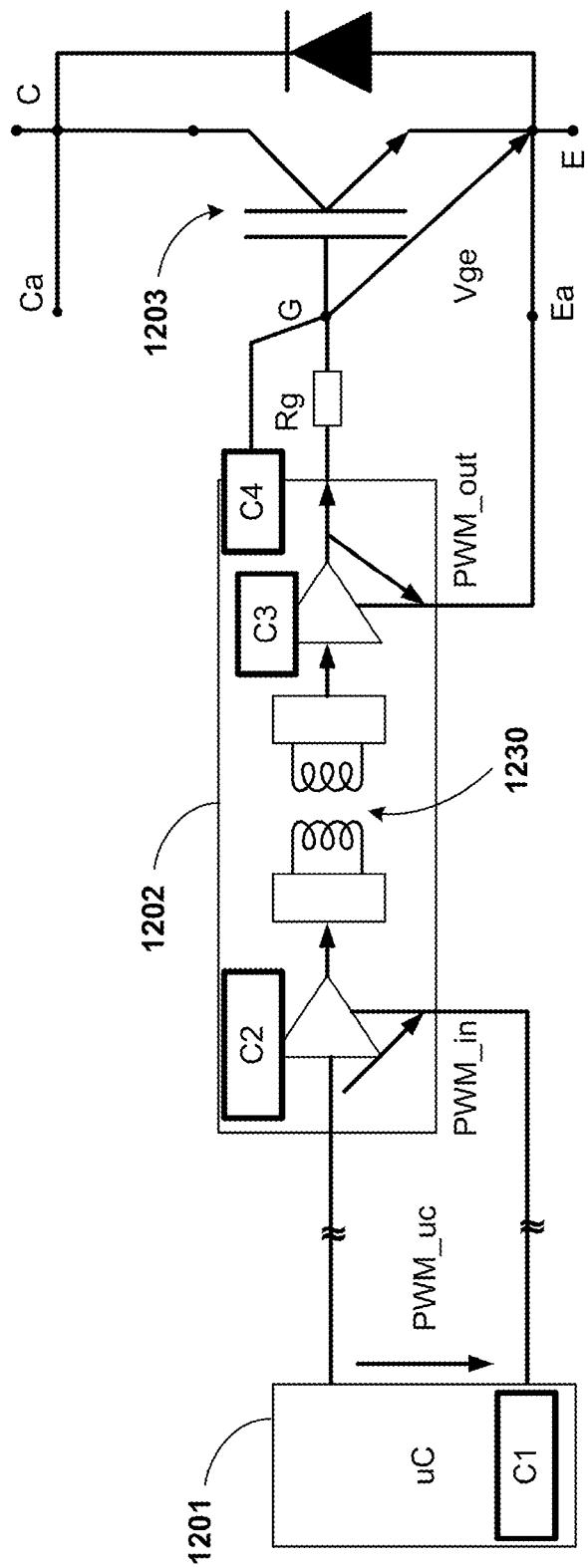
FIGS. 12 and 13 are circuit diagrams showing different circuit systems consistent with this disclosure.

FIG. 12 is another circuit diagram of a system consistent with this disclosure. The system shown in FIG. 12 is similar to that of FIG. 4 in many respects. The system of FIG. 12 includes a driver circuit 1202 configured to control a power switch circuit 1203 according to this disclosure. Driver circuit 1202 may comprise a galvanic isolation barrier 1230 that separates a first voltage domain (e.g., a low voltage domain associated with processor 1201) from a second voltage domain (e.g., a high voltage domain associated with power switch circuit 1203). Galvanic isolation barrier 1230, for example, can be implemented with one or more coiled transformers, one or more coreless transformers, one or more capacitors, or other elements that are capable of galvanically isolating two different voltage domains within driver circuit 1202.

Driver circuit 1202 may comprise an input pin configured to receive PM control signals (PWM_in) from a processor 1201. One or more input elements, such as amplifiers, filters, or other signal conditioning components may filter, amplify, or otherwise condition the received input, e.g., to remove unwanted noise. Driver circuit 1202 may also comprise an output pin galvanically isolated from the input pin, wherein the driver circuit is configured to deliver PM drive signals (PWM_out) from the output pin to a gate of a power switch circuit 1203 to control ON/OFF switching of the power switch. One or more output elements such as amplifiers, filters, or other signal conditioning components may filter, amplify, or otherwise condition the signals, e.g., to remove unwanted noise. A gate resistor may be included between driver circuit 1202 and power switch circuit 1203. An output counter (C3) may comprise a storage register configured to store counts associated with the PM drive signals. In this way, driver circuit 1202 can store at least a partial history of the PM drive signals applied to power switch circuit 1203, e.g., for later readout.

Similar to other examples, in the example shown in FIG. 12, a plurality of counters may be used throughout the system of to track PM signals at different circuit locations, which can facilitate comparisons amongst the PM signals at the different locations. In the example of FIG. 12, driver circuit includes both an output counter (C3) configured to store counts of PM drive signals, and an input counter (C2), i.e., an input register configured to store counts of PM control signals received from processor 1201. Moreover, processor 1201 may comprise yet another register, i.e., processor counter (C1) configured to store counts of the PM control signals sent by processor 1201. Counters C1, C2, and C3 may comprise storage registers, such as described herein.

As further shown in FIG. 12, driver 1202 may include an additional counter C4, i.e., a fourth register within the system configured to store counts associated with PM signals on a gate clamp pin of driver circuit 1202. Some driver circuits, for example, include a gate clamp pin for monitoring the gate to emitter voltage "Vge" over power switch 1203. Such driver designs present an opportunity to implement counter C4 to count rising and falling edges associated with the PM signals on the gate clamp pin. As with other examples herein, by comparing the contents of two or more of counters C1, C2, C3 and/or C4, counter mismatch can be identified to indicate a potential PM signaling problem within the system. Counter C4 is another example of a desirable location for a counter to track PM signals within the system.

Figure 13:
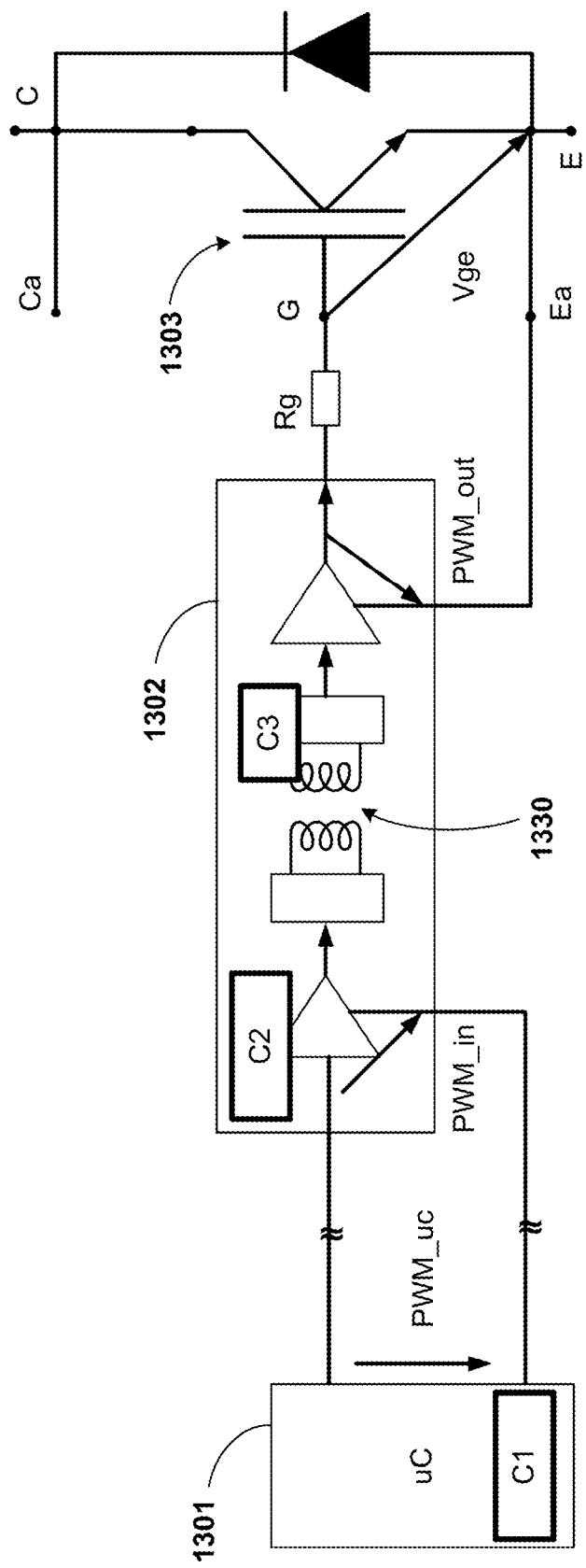

FIG. 13 is another circuit diagram of a system consistent with this disclosure. The system shown in FIG. 13 is similar to that of FIG. 4 in many respects. The system of FIG. 13 includes a driver circuit 1302 configured to control a power switch circuit 1303 according to this disclosure. Driver circuit 1302 may comprise a galvanic isolation barrier 1330 that separates a first voltage domain (e.g., a low voltage domain associated with processor 1301) from a second voltage domain (e.g., a high voltage domain associated with power switch circuit 1303). Galvanic isolation barrier 1330, for example, can be implemented with one or more coiled transformers, one or more coreless transformers, one or more capacitors, or other elements that are capable of galvanically isolating two different voltage domains within driver circuit 1302.

Driver circuit 1202 may comprise an input pin configured to receive PM control signals (PWM_in) from a processor 1301. One or more input elements, such as amplifiers, filters, or other signal conditioning components may filter, amplify, or otherwise condition the received input, e.g., to remove unwanted noise. Driver circuit 1302 may also comprise an output pin galvanically isolated from the input pin, wherein the driver circuit is configured to deliver PM drive signals (PWM_out) from the output pin to a gate of a power switch circuit 1303 to control ON/OFF switching of the power switch. One or more output elements such as amplifiers, filters, or other signal conditioning components may filter, amplify, or otherwise condition the signals, e.g., to remove unwanted noise. A gate resistor may be included between driver circuit 1302 and power switch circuit 1303. An output counter (C3) may comprise a storage register configured to store counts associated with the PM drive signals. In this way, driver circuit 1302 can store at least a partial history of the PM drive signals applied to power switch circuit 1303, e.g., for later readout.

In the example of FIG. 13, output counter C3 is implemented close to galvanic isolation barrier 1330, e.g., as far as possible from power switch 1303, which can help avoid problems or damage to output counter C3 in the event of device failure. Of course, it is also possible to implement output counter C3 shown in FIG. 4 in combination with output counter C3 shown in FIG. 13, possibly along with other counters as described here. In any case, FIG. 13 shows a possible alternative (or addition) for the location of output counter C3.

Counter registers within a power switch control and driver system, such as described here, may be implemented in volatile or non-volatile memory. Non-volatile memory may be more desirable, as it allows for readout even if there are supply problems that limit power to the counters. In some examples, PM signals are counted at locations as close as possible to output stage. In other examples, counter registers can be implemented in a die as far as possible from the output stage to limit damage in case of power switch failures. In some examples, a driver circuit may be configured to copy output registers from a high voltage side to corresponding shadow registers on a low voltage side, to enable readouts after HV supply failure.

Counters may be long enough to store a desired number of n pulses, which vary for different scenarios. Counters between 4 and 16 bits may have sufficient capacity for counting PM signals, and overflow counting as wells as tracking of least significant bits may be used to store data in the counters. Readout of counters may occur during a PWM OFF Mode, e.g., when gate driver enable pin is low, during a driver reset, or in other situations where PM signals are disabled.

In some examples, a microcontroller may be configured to readout and compare high-side and low-side switch counters from high side and low side driver circuits. In some examples, input counters on a driver circuit (e.g., C2) may be implemented after input filters (e.g., direct at the signal transfer LV to HV). In some examples, counter registers may be analyzed manual by an engineer (e.g., via a dump report) for circuit failure analysis. This can ensure that the techniques do not cause false circuit failures. In other cases, however, it may be desirable for driver circuits to react to counter mismatch, which can improve safety but could cause a false circuit failure if mismatch is identified while the circuit is still in good operational shape.

Half-bridge configurations may use gate drivers pulse counting of interlock features. Only one switch can be turned-on, in this case, to prevent bridge shoot through, and if interlock is used to prevent simultaneous turn on, this event can be counted for later analysis. In some examples, C2 counters may be used for counting pulses for both the high side and low side for identifying situations of interlock.

Many gate drivers include a gate clamp pin, in which case a C4 counting register may be desirable on the gate clamp pin. Counter mismatch may be the result of a signal error, but counter mismatch can also be caused by slow switching that cannot properly react to short pulses. Accordingly, in some cases, the circuits and techniques of this disclosure can be beneficial for a control unit to identify whether a pulse pattern is too fast for a power switch.

In some examples, one or more C3 counters may be located direct after the LV/HV communication line so that the signal is close to digital signal and at output stage the signal is a slow ramp.

Counter data transfer or readout may be implemented in many ways. As noted, in some cases, a driver circuit or processor may be configured to react to counter mismatch. In other cases, however, these is no active data transfer to the processor. In this case, the registers just readable. In any case, a microprocessor (or technician) can decide when to read the counter registers. Readout during PWM operation has the risk that not all registers are in sync (data integrity). Readout during PWM stop (e.g., driver enable signal is Low, a desaturation event, a reset, or other situations where PM signals are disabled) may help to ensure data integrity.

Alternatively, a continuous data transfer may have advantages that after failure, there is a higher likelihood that data is captured and stored but this may have a higher cost and complexity, with limited data integrity improvement beyond the situation of PWM stop operation.

There may also be challenges in defining which pulses to count within a driver circuit. In general, the system may be configured to count only those pulses which the gate driver itself should interpretate as a signal. Thus, in some examples, glitches in the input and output stages, e.g., transitions on the order of 1 nanosecond (e.g., less than 5 nanoseconds) may be ignored and not counted.

Figure 14:
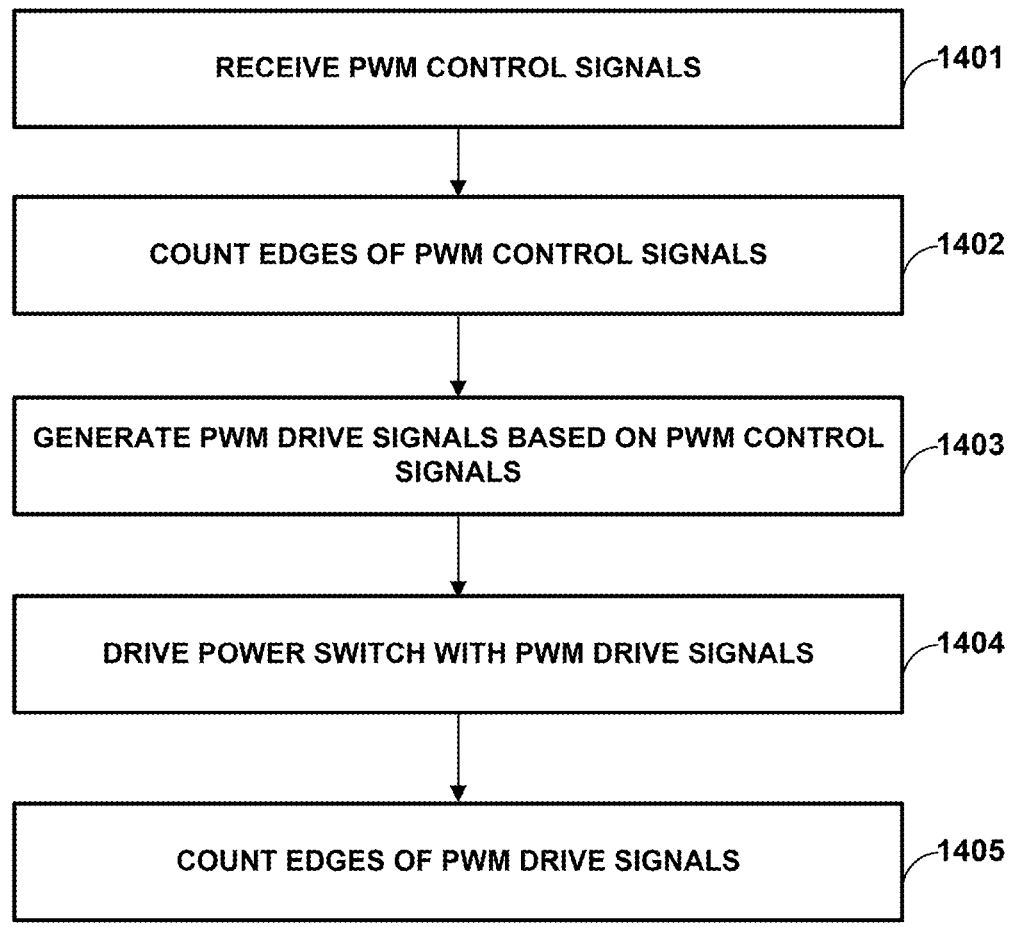
FIGS. 14 and 15 are flow diagrams showing some techniques consistent with this disclosure.

FIG. 14 is a flow diagram from the perspective of a gate driver circuit. FIG. 14 will be described from the perspective of driver circuit 102 of FIG. 1, although other driver circuits may perform similar techniques. As shown in FIG. 14, in controlling a power switch a driver circuit 102 may be configured to receive PM control signals from a processor 106 via an input pin 112 of driver circuit 102 (1401). In some cases, processor 106 includes a processor register 124 configured to count edges of the PM control signals that are being sent to driver circuit 102.

Input register 122 of driver circuit is configured to count edges of the PM control signals (1402). Based on the PM control signals, driver circuit 102 is configured to generate PM drive signals (1403) and drive a power switch within power switch circuit 104 based on the PM drive signals (1404). In particular, driver circuit may deliver PM drive signals from an output pin 114 of driver circuit 102 to the power switch within power switch circuit 104 to control ON/OFF switching of the power switch. According to this disclosure, driver circuit 102 also includes an output register 120 configured to count edges of the PM drive signals (1405). In other words, output register 120 is configured to store counts associated with the PM drive signals.

In some examples, such as shown in FIG. 8, an output register 820 may reside on a high voltage side of driver circuit 802, and driver circuit 802 may have a corresponding shadow output register 825 on the low voltage side. Shadow output register 825, for example, may get periodically updated with the content of output register 820 when PM signals are disabled in driver circuit 802. This can facilitate easy readout of input register 822 and shadow output register 825 by processor 806 so that count comparisons can be made, e.g., for circuit analysis purposes.

Figure 15:
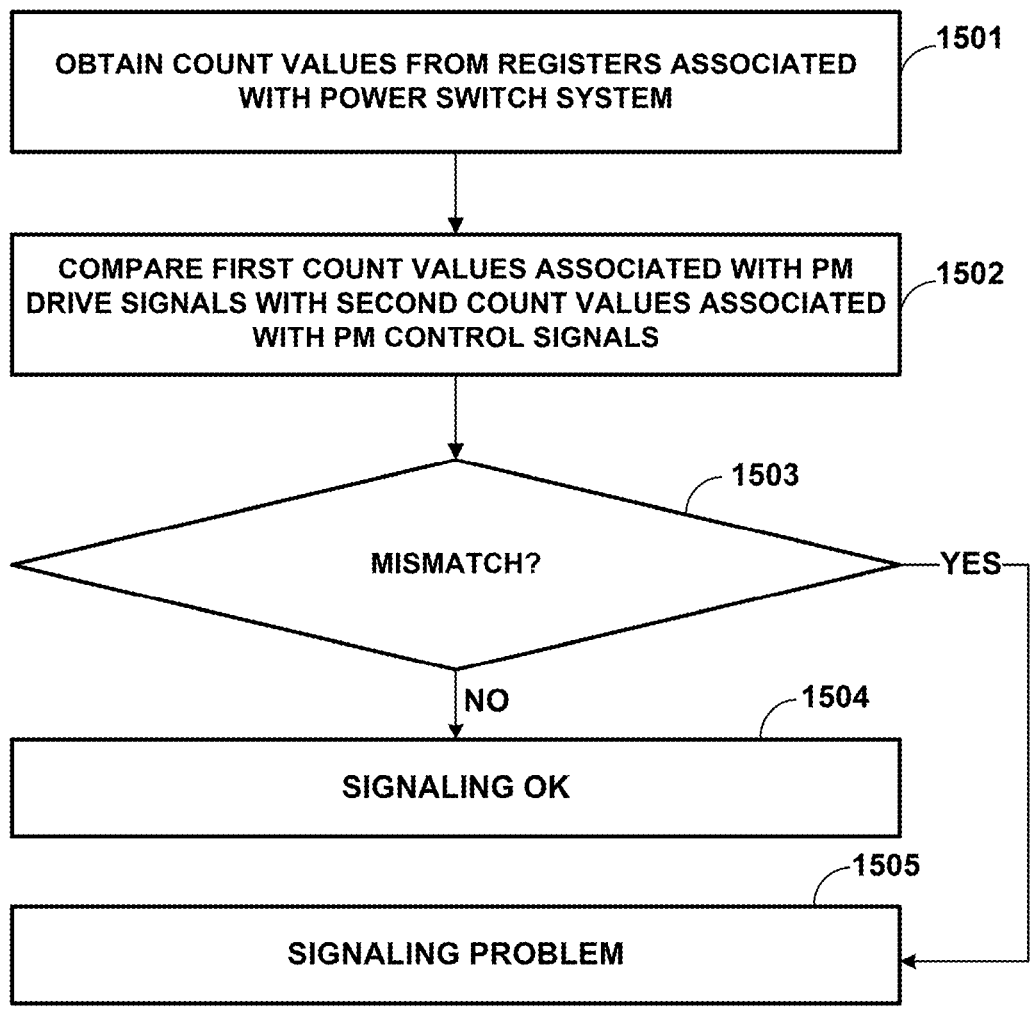

FIG. 15 is a flow diagram showing one example of the analysis of PM count registers according to this disclosure. The process of FIG. 15, for example, may be performed after a circuit or device failure to help diagnose the cause of the failure. As shown in FIG. 15, a technician may obtain count values from two or more different registers associated with a power switch system (1501). The technician may compare first count values associated with PM drive signals with second count values associated with PM control signals (1502) to identify whether there is a mismatch between the counters (1503). If there is no mismatch (no branch of 1503), then the PM signaling is OK (1504). However, if there is mismatch between the counters (yes branch of 1503), this mismatch may indicate a signaling problem (1505). Moreover, if there are three or more counters located in specific locations of the driver circuit system, then the location of the mismatch may help pinpoint the location where circuit problems occurred.

Thus, a method of analyzing operation of a power switch may comprise comparing first count values associated with PM drive signals associated with a driver circuit with second count values associated with PM control signals from a processor, and identifying a potential problem with operation of the power switch based on the comparison indicating a mismatch between the first count values and the second count values. The method may include comparing the first count values associated with the PM drive signals from the driver circuit with the second count values and with third count values wherein the third count values correspond to gate clamp signals associated with a gate clamp pin of the driver circuit.

The following clauses may illustrate one or more aspects of the disclosure.

Clause 1—A driver circuit configured to control a power switch, the driver circuit comprising: an input pin configured to receive PM control signals from a processor; an output pin galvanically isolated from the input pin, wherein the driver circuit is configured to deliver PM drive signals from the output pin to the power switch to control ON/OFF switching of the power switch; and a register configured to store counts associated with the PM drive signals.

Clause 2—The driver circuit of clause 1, wherein the register comprises a non-volatile memory that is readable by the processor.

Clause 3—The driver circuit of clause 1 or 2, wherein the register comprises a first register, the driver circuit further comprising a second register configured to store counts associated with the PM control signals.

Clause 4—The driver circuit of clause 3, further comprising a third register configured to store counts associated with the PM drive signals, wherein the second register is galvanically isolated from the third register, wherein the second register is located in a first voltage domain and the third register is located in a second voltage domain, and wherein the first register is a shadow register located in the first voltage domain and configured to store a shadow of the third register when the PM drive signals are disabled.

Clause 5—The driver circuit of clause 3 or 4, wherein the first register and the second register comprise non-volatile memory that is readable by the processor when the PM drive signals are disabled.

Clause 6—The driver circuit of any of clauses 1-5, further comprising a gate clamp pin and a gate clamp resister (e.g., a fourth register) configured to store counts associated with PM signals on the gate clamp pin.

Clause 7—The driver circuit of any of clauses 3-6, wherein the driver circuit is configured to disable the PM drive signals in response to identifying a mismatch between the first register and the second register.

Clause 8—The driver circuit of any of clauses 1-7, wherein the register comprises an overflow register that is configured to store N bits of data, wherein N is an integer greater than 3 and less than 17.

Clause 9—The driver circuit of any of clauses 1-8, wherein the counts identify a number of rising edges and falling edges of the PM drive signals.

Clause 10—A method of controlling a power switch, the method comprising: receiving PM control signals from a processor via an input pin of a driver circuit; delivering PM drive signals from an output pin of the driver circuit to the power switch to control ON/OFF switching of the power switch; and storing counts associated with the PM drive signals in a register associated with the driver circuit.

Clause 11—The method of clause 10, wherein the register comprises a first register, the method further comprising: storing counts associated with the PM control signals in a second register.

Clause 12—The method of clause 11, wherein a third register is galvanically isolated from the second register, wherein the second register is located in a first voltage domain and the third register is located in a second voltage domain, the method further comprising: storing a shadow of the third register in the first register in response to disabling the PM drive signals, wherein the first register is a shadow register associated with the third register and the first register is located in the first voltage domain.

Clause 13—The method of any of clauses 10-12, further comprising storing counts associated with PM signals on a gate clamp pin in gate clamp register (e.g., a fourth register).

Clause 14—The method of any of clauses 11-13, further comprising enabling readout of the first register and the second register in response to disabling the PM drive signals.

Clause 15—A system comprising: a processor; a power switch; and a driver circuit configured to control the power switch, the driver circuit comprising: an input pin configured to receive pulse modulation (PM) control signals from the processor; an output pin galvanically isolated from the input pin, wherein the driver circuit is configured to deliver PM drive signals from the output pin to the power switch to control ON/OFF switching of the power switch; and a register configured to store counts associated with the PM drive signals, wherein the register is readable by the processor.

Clause 16—The system of clause 15, wherein the register comprises a first register, the driver circuit further comprising a second register configured to store counts associated with the PM control signals.

Clause 17—The system of clause 16, wherein the first register comprises a shadow register located in a first voltage domain that stores a shadow of a third register located in a second voltage domain in response to the PM drive signals being disabled, and wherein the first register and the second register comprise non-volatile memory that is readable by the processor in response to the PM drive signals being disabled.

Clause 18—The system of any of clauses 15-17, wherein the driver circuit further comprises a gate clamp pin and a gate clamp register (e.g., a fourth register) configured to store counts associated with PM signals on the gate clamp pin.

Clause 19—The system of any of clauses 15-18, wherein the register comprise a driver register and wherein processor includes a processor register configured to store counts associated with the PM control signals.

Clause 20—The system of any of clauses 15-19, wherein the driver circuit comprises a first driver circuit and the power switch comprises a high side power switch, the system further comprising: a low side power switch, wherein the low side power switch and the high side power switch form a half-bridge circuit; and a second driver circuit configured to control the low side power switch, the second driver circuit comprising: a low side input pin configured to receive low side PM control signals from the processor; a low side output pin galvanically isolated from the low side input pin, wherein the second driver circuit is configured to deliver low side PM drive signals from the low side output pin to the low side power switch to control ON/OFF switching of the low side power switch; and a low side register configured to store counts associated with the low side PM drive signals, wherein the low side register is readable by the processor.

Clause 21—The system of clause 20, further comprising an interlock register configured to store counts associated with instances where the high side PM control signals and the low side PM control signals are both simultaneously high.

Clause 22—A method of analyzing operation of a power switch, the method comprising: comparing first count values associated with pulse modulation (PM) drive signals associated with a driver circuit with second count values associated with PM control signals from a processor; and identifying a potential problem with operation of the power switch based on the comparison indicating a mismatch between the first count values and the second count values.

Clause 23—The method of clause 22, wherein comparing comprises: comparing the first count values associated with the PM drive signals from the driver circuit with the second count values and with third count values wherein the third count values correspond to gate clamp signals associated with a gate clamp pin of the driver circuit.

Various aspects have been described in this disclosure. These and other aspects are within the scope of the following claims.

The invention claimed is:

1. A driver circuit configured to control a power switch, the driver circuit comprising:
an input pin configured to receive pulse modulation (PM) control signals from a processor;
an output pin galvanically isolated from the input pin, wherein the driver circuit is configured to deliver PM drive signals from the output pin to the power switch to control ON/OFF switching of the power switch;
a first register configured to store counts of the PM drive signals, wherein the counts of the PM drive signals count a number of rising and/or falling edges of the PM drive signals; and
a second register configured to store counts of the PM control signals, wherein the counts of the PM control signals count a number of rising and/or falling edges of the PM control signals,
wherein PM signaling in the driver circuit is OK when there is no mismatch between the stored counts in the first register relative to the stored counts in second register, and
wherein a PM signaling problem exists in the driver circuit when there is mismatch between the stored counts in the first register relative to the stored counts in second register.

2. The driver circuit of claim 1, wherein the first register and the second register each comprises a non-volatile memory that is readable by the processor.

3. The driver circuit of claim 1, further comprising a third register configured to store counts of the PM drive signals,
wherein the second register is galvanically isolated from the third register,
wherein the second register is located in a first voltage domain and the third register is located in a second voltage domain, and
wherein the first register is a shadow register located in the first voltage domain and configured to store a shadow of the third register when the PM drive signals are disabled.

4. The driver circuit of claim 3, wherein the first register and the second register are readable by the processor when the PM drive signals are disabled.

5. The driver circuit of claim 3, further comprising a gate clamp pin and a fourth register configured to store counts of PM signals on the gate clamp pin, wherein the counts of the PM signals on the gate clamp pin count a number of rising and/or falling edges of the PM signals on the gate clamp pin.

6. The driver circuit of claim 3, wherein the driver circuit is configured to disable the PM drive signals in response to the mismatch between the stored counts in the first register relative to the stored counts in the second register.

7. The driver circuit of claim 1, wherein the first register and the second register each comprise an overflow register that is configured to store N bits of data, wherein N is an integer greater than 3 and less than 17.

8. A method of controlling a power switch, the method comprising:
receiving pulse modulation (PM) control signals from a processor via an input pin of a driver circuit;
delivering PM drive signals from an output pin of the driver circuit to the power switch to control ON/OFF switching of the power switch;
storing counts of the PM drive signals in a first register associated with the driver circuit, wherein the counts associated with the PM drive signals comprise a number of rising and/or falling edges of the PM drive signals; and
storing counts of the PM control signals in a second register, wherein the counts of the PM control signals count a number of rising and/or falling edges of the PM control signals,
wherein PM signaling in the driver circuit is OK when there is no mismatch between the stored counts in the first register relative to the stored counts in second register, and
wherein a PM signaling problem exists in the driver circuit when there is mismatch between the stored counts in the first register relative to the stored counts in second register.

9. The method of claim 8,
wherein a third register is galvanically isolated from the second register,
wherein the second register is located in a first voltage domain and the third register is located in a second voltage domain, the method further comprising:
storing a shadow of the third register in the first register in response to disabling the PM drive signals, wherein the first register is a shadow register associated with the third register and the first register is located in the first voltage domain.

10. The method of claim 9, further comprising storing counts of PM signals on a gate clamp pin in a fourth register, wherein the counts of the PM signals on the gate clamp pin count a number of rising and/or falling edges of the PM signals on the gate clamp pin.

11. The method of claim 9, further comprising enabling readout of the first register and the second register in response to disabling the PM drive signals.

12. A system comprising:
a processor;
a power switch; and
a driver circuit configured to control the power switch, the driver circuit comprising:
an input pin configured to receive pulse modulation (PM) control signals from the processor;
an output pin galvanically isolated from the input pin, wherein the driver circuit is configured to deliver PM drive signals from the output pin to the power switch to control ON/OFF switching of the power switch;
a first register configured to store counts of the PM drive signals, wherein the first register is readable by the processor, wherein the counts of the PM drive signals count a number of rising and/or falling edges of the PM drive signals; and
a second register configured to store counts of the PM control signals, wherein the counts of the PM control signals count a number of rising and/or falling edges of the PM control signals,
wherein PM signaling in the driver circuit is OK when there is no mismatch between the stored counts in the first register relative to the stored counts in second register, and
wherein a PM signaling problem exists in the driver circuit when there is mismatch between the stored counts in the first register relative to the stored counts in second register.

13. The system of claim 12,
wherein the first register comprises a shadow register located in a first voltage domain that stores a shadow of a third register located in a second voltage domain in response to the PM drive signals being disabled, and
wherein the first register and the second register comprise non-volatile memory that is readable by the processor in response to the PM drive signals being disabled.

14. The system of claim 13, wherein the driver circuit further comprises a gate clamp pin and a fourth register configured to store counts of PM signals on the gate clamp pin, wherein the counts of the PM signals on the gate clamp pin count a number of rising and/or falling edges of the PM signals on the gate clamp pin.

15. The system of claim 12, wherein the first and second registers comprise driver registers and wherein processor includes a third register configured to store counts of the PM control signals, wherein the counts of the PM control signals in the third register count a number of rising and/or falling edges of the PM control signals at the processor.

16. The system of claim 12, wherein the driver circuit comprises a first driver circuit, the PM control signals comprise high side PM control signals, and the power switch comprises a high side power switch, the system further comprising:

a low side power switch, wherein the low side power switch and the high side power switch form a half-bridge circuit; and
a second driver circuit configured to control the low side power switch, the second driver circuit comprising:
a low side input pin configured to receive low side PM control signals from the processor;
a low side output pin galvanically isolated from the low side input pin, wherein the second driver circuit is configured to deliver low side PM drive signals from the low side output pin to the low side power switch to control ON/OFF switching of the low side power switch;
a first low side register configured to store counts of the low side PM drive signals, wherein first the low side register is readable by the processor, wherein the counts of the low side PM drive signals count a number of rising and/or falling edges of the low side PM drive signals; and
a second low side register configured to store counts of the low side PM control signals, wherein the counts of the low side PM control signals count a number of rising and/or falling edges of the low side PM control signals,
wherein PM signaling in the second driver circuit is OK when there is no mismatch between the stored counts in the first low side register relative to the stored counts in second low side register, and
wherein a PM signaling problem exists in the second driver circuit when there is mismatch between the stored counts in the first low side register relative to the stored counts in second low side register.

17. The system of claim 16, further comprising an interlock register configured to store counts of instances where the high side PM control signals and the low side PM control signals are both simultaneously high.

18. A driver circuit configured to control a power switch, the driver circuit comprising:
an input pin configured to receive pulse modulation (PM) control signals from a processor;
an output pin galvanically isolated from the input pin, wherein the driver circuit is configured to deliver PM drive signals from the output pin to the power switch to control ON/OFF switching of the power switch; and
a register configured to store counts associated with the PM drive signals, wherein the register comprises an overflow register that is configured to store N bits of data, wherein N is an integer greater than 3 and less than 17.

19. The driver circuit of claim 18, wherein the register is a first register, the driver circuit further comprising:
a second register configured to store counts of the PM control signals, wherein the counts of the PM control signals count a number of rising and/or falling edges of the PM control signals, and wherein the second register comprises a second overflow register that is configured to store N bits of data,
wherein PM signaling in the driver circuit is OK when there is no mismatch between the stored counts in the first register relative to the stored counts in second register, and
wherein a PM signaling problem exists in the driver circuit when there is mismatch between the stored counts in the first register relative to the stored counts in second register.

\* \* \* \* \*